United States Patent [19]
Inoue et al.

[11] Patent Number: 5,252,141
[45] Date of Patent: Oct. 12, 1993

[54] MODULAR SOLAR CELL WITH PROTECTIVE MEMBER

[75] Inventors: Yuji Inoue; Hiroshi Yamamoto, both of Nagahama, Japan

[73] Assignee: Canon Kabushiki Kaisha, Tokyo, Japan

[21] Appl. No.: 837,876

[22] Filed: Feb. 20, 1992

[30] Foreign Application Priority Data

Feb. 20, 1991 [JP] Japan ................................. 3-045584
May 16, 1991 [JP] Japan ................................. 3-139476

[51] Int. Cl.$^5$ ............................................. H01L 31/048
[52] U.S. Cl. .................................... 136/251; 136/259; 136/291
[58] Field of Search ..................... 136/251, 259, 291; 52/173 R

[56] References Cited

U.S. PATENT DOCUMENTS

| | | | |
|---|---|---|---|
| 3,982,963 | 9/1976 | Mahoney et al. | 136/251 |
| 4,189,881 | 2/1980 | Hawley | 52/220 |
| 4,231,807 | 11/1980 | Keeling et al. | 136/251 |
| 4,433,200 | 2/1984 | Jester et al. | 136/251 |
| 4,633,032 | 12/1986 | Oido et al. | 136/251 |
| 4,636,577 | 1/1987 | Peterpaul | 136/206 |
| 4,692,557 | 9/1987 | Samuelson et al. | 136/251 |
| 5,092,939 | 3/1992 | Nath et al. | 136/251 |

FOREIGN PATENT DOCUMENTS

| | | | |
|---|---|---|---|
| 3235493 | 3/1984 | Fed. Rep. of Germany | 136/251 |
| 3513910 | 10/1986 | Fed. Rep. of Germany | 136/251 |
| 8329884 | 12/1987 | Fed. Rep. of Germany | 136/251 |
| 59-125671 | 7/1984 | Japan | 136/251 |
| 60-7761 | 1/1985 | Japan | 136/251 |
| 60-214550 | 10/1985 | Japan | 136/251 |
| 61-090472 | 12/1986 | Japan | 136/251 |
| 62-87461 | 6/1987 | Japan | 136/251 |
| 62-87462 | 6/1987 | Japan | 136/251 |
| 62-20123 | 8/1987 | Japan | 136/251 |
| 2-21670 | 1/1990 | Japan | 136/251 |
| 2-47065 | 3/1990 | Japan | 136/251 |

OTHER PUBLICATIONS

"Photovoltaic Roofs" by Robert W. Drummond et al. NTIS Tech Notes; No. 1C, Jan. 1985, Springfield, Va., US.; p. 79.

*Primary Examiner*—Aaron Weisstuch
*Attorney, Agent, or Firm*—Fitzpatrick, Cella, Harper & Scinto

[57] ABSTRACT

A solar cell module including at least one photovoltaic device, covering material for covering the at least one photovoltaic device, and a frame for covering the end portions of the covering materials. The covering materials are provided, in the end portions thereof, with a recess or a penetrating hole. The frame is provided with a projection adapted to engage with the recess or penetrating hole.

14 Claims, 15 Drawing Sheets

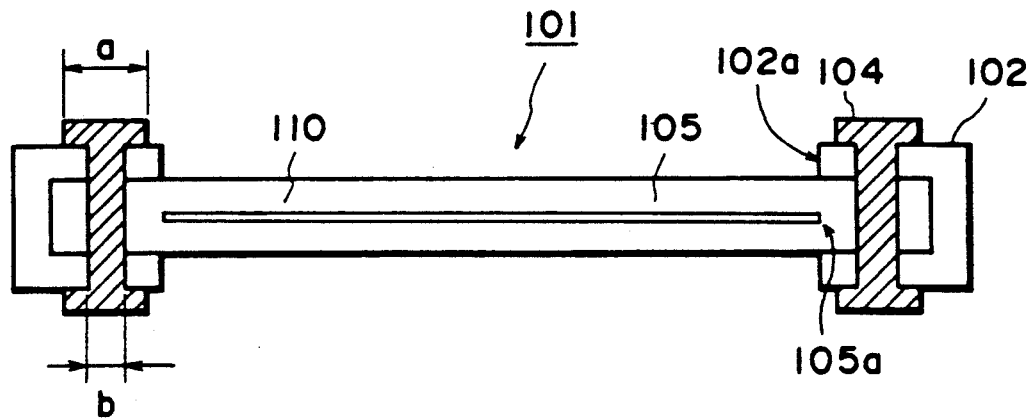
FIG. 3
FIG. 4A
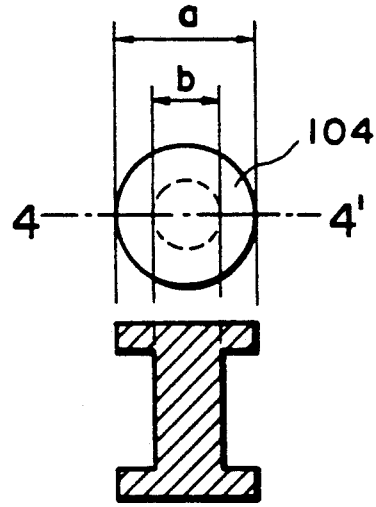
FIG. 4B

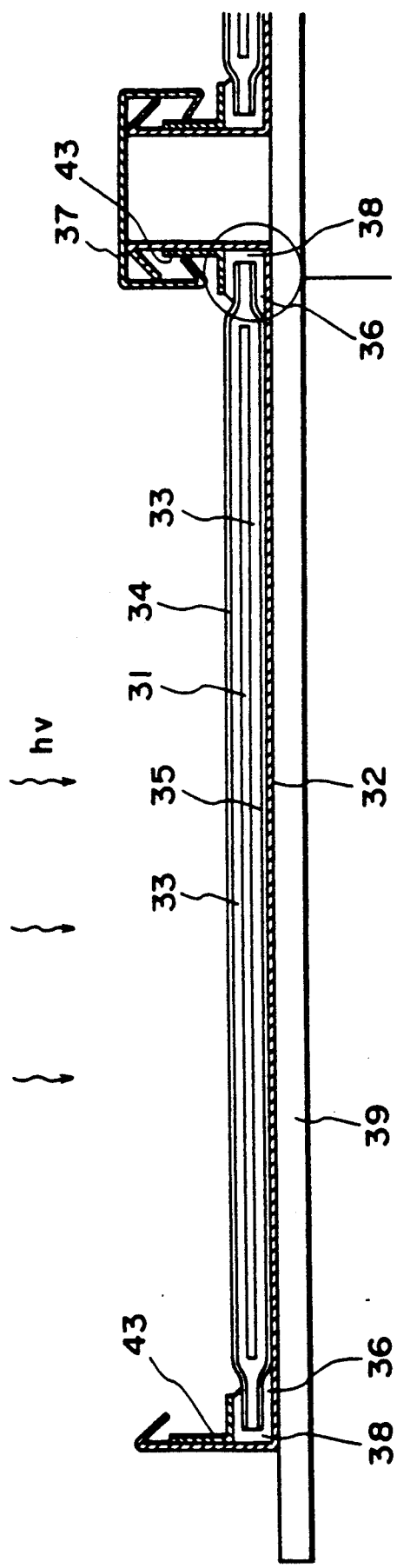
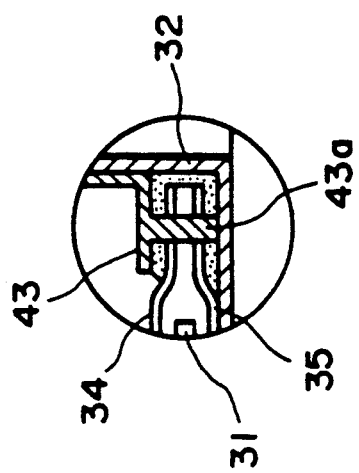
FIG. 21A
FIG. 21B

MODULAR SOLAR CELL WITH PROTECTIVE MEMBER

BACKGROUND OF THE INVENTION

1. Field of the Invention

The present invention relates to a solar cell adapted for use in various electronic equipment or electric power supply devices, and more particularly to a modular solar cell with an improved protective member constituting protective means therefor.

2. Related Background Art

Because of the recent forecast for the warming of the entire earth by the greenhouse effect resulting from the increase of atmospheric $CO_2$, the need has become stronger for clean energy production without $CO_2$ discharge. However, nuclear power generation, which is free from $CO_2$ discharge, is still associated with the problem of disposal of radioactive products, so that clean energy with improved safety is desired. Among the future candidates of such clean energy, the solar cell is very desirable because of its cleanness, safety, and easy handling.

Among various solar cells, those based on non-monocrystalline semiconductors such as amorphous silicon or copper indium selenide are the subjects of intensive developmental works, as these materials can be prepared in a large area and with a low production cost. If impact resistance or flexibility is required, such solar cells are often formed on a metal substrate such as of stainless steel.

For the purpose of reducing the weight of the solar cell formed on the stainless steel substrate, ensuring flexibility, and providing weather resistance and impact resistance, such solar cell is sealed with a resin such as a fluorinated resin or ethylene vinyl acetate (EVA). After such resin sealing, the end portions of the solar cell are covered with a protective frame composed of a metal such as aluminum or a polymer such as polyvinyl chloride or synthetic rubber, for the purpose of protecting the end faces and providing a support member. Particularly if flexibility is required for the solar cell module, there is usually employed a flexible polymer such as synthetic rubber of soft polyvinyl chloride.

The fixation between the end portions of the sealed solar cell and the protective frame, for example of polymer material, is achieved by an adhesive material, after the contact faces are pre-treated with plasma, strong acid, or strong alkali for facilitating the adhesion.

FIG. 1 is a schematic cross-sectional view of a conventional prior art solar cell.

In FIG. 1 there are shown a solar cell device 401 formed on a conductive substrate; a resinous covering material 404 for sealing said solar cell device 401; a resin-sealed solar cell 402; and a protective frame 403 composed of flexible resin. The outermost layer of the resin 404 is usually composed of a fluorinated resin, in consideration of weather resistance. Also the protective frame 403 is usually composed of synthetic rubber or soft polyvinyl chloride, in consideration of the weather resistance and flexibility.

Since the fluorinated resin, employed for sealing the solar cell and the synthetic rubber or soft polyvinyl chloride constituting the protective frame are difficult to adhere with, the adhesion with the adhesive material is executed after the contact faces of the resin 404 and the protective frame 403 are pretreated with plasma, strong acid, or strong alkali, for facilitating the adhesion.

Although the solar cells are sometimes use indoors under the light of fluorescent lamps, those used outdoors are required to have sufficient durability to the influence of various ambient conditions such as high temperature, low temperature, high humidity, rain, wind, etc. For this reason, the conventional solar cell module is usually composed of a seal portion 4040 for the solar cell device and a frame portion 403.

FIG. 2 is a schematic cross-sectional view of another conventional prior art solar cell module.

In a laminate member 21 constituting the solar cell module, the light-receiving face (upper face in the drawing) of a solar cell device 22 is covered, via an adhesive material 23, by a sheet-like surface protecting material 25 composed of transparent resin, while the rear face (lower face) of the device 22 is covered, via an adhesive material 23, by sheet-like rear face protecting material 25. Said coverings are provided by vacuum lamination, and the solar cell device 22 is hermetically sealed inside. The laminate member 21 is cut at positions outside the solar cell device 22, and the cut faces constitute the end faces 21c, 21d of said laminar member 21.

Aluminum frames 26, 27 for supporting the laminate member 21 are respectively provided with grooves 26a, 27a, into which are respectively inserted the edge portions 21a, 21b of the laminate member 21. Fillers 26f, 27f, for example of silicone rubber are provided in the gaps between the edges 21a, 21b and the grooves 26a, 27a, in order to prevent intrusion of water and vapor into the interior of the laminate member 21.

The solar cell modules constructed as shown in FIGS. 1 and 2 are positioned outdoors and used under various climatic conditions such as high temperature, low temperature, high humidity, wind, rain, etc.

However, the adhesive strength still is not sufficiently high even with the above-mentioned pretreatment, and the frames 403, 26, 27 may be dismantled when a strong external force is applied.

Adequate reliability cannot be attained even when the adhesive strength is increased by the above-mentioned pretreatment prior to the adhesion, the frames 403, 26, 27 may be dislodged from the solar cell module after prolonged outdoor use or by a strong external force.

Such dislodging of frames leads to peeling of the covering material of the solar cell from the end faces thereof, thus deteriorating the quality of the solar cell.

Also the filler, for example of silicone rubber, filled in the gaps between the frame grooves and the edge portions of the covering material as in the solar cell module shown in FIG. 2, often does not have a sufficiently low moisture permeability even though the water absorbability is low. Besides, the complete filling of said gaps with the filler is difficult, and said gaps eventually remain incompletely filled. As a result, moisture enters the grooves in the course of use of the solar cell and eventually reaches the solar cell device through the cut end faces of the module, thereby causing shortcircuiting of the solar cell device or destruction thereof by peeling of the thin film thereof.

SUMMARY OF THE INVENTION

An object of the present invention is to resolve the above-mentioned drawbacks and to provide a highly reliable solar cell module which does not deteriorate after prolonged outdoor use or under a strong external force.

Another object of the present invention is to provide a solar cell module with an improved ability for preventing moisture intrusion from the end faces of the module edges, inserted into the frame grooves, into the interior of the module.

Still another object of the present invention is to provide a solar cell provided with a photovoltaic device, covering materials covering said device, and a frame member covering the end portion of said covering materials, wherein said covering materials are provided, in the end portion thereof, with recess(es) or penetrating hole(s) while said frame is provided with projection(s) engaging with said recess(es) or penetrating hole(s).

Still another object of the present invention is to provide a solar cell module provided with:

a solar cell including a photovoltaic device, and a covering material for covering said photovoltaic device;

a support member for supporting said solar cell; and a protective member for protecting the end portions of at least two adjacent support members in an array of plural support members;

wherein said support members are each composed of a plate-shaped deformable member, the end portion of which being folded so as to form a slit for accommodating the end portion of said covering material.

Still another object of the present invention is to provide a solar cell module provided with:

a solar cell including a photovoltaic device, and a covering material for covering said photovoltaic device;

a support member for supporting said solar cell; and a protective member for protecting the end portions of at least two adjacent support members in an array of plural support members;

wherein said support members are each provided, at the end portion thereof, with another member so as to form a slit for accommodating the end portion of said covering material.

The solar cell module of the present invention, including a solar cell sealed in a covering material and a protective frame for protecting the end portion of said solar cell by compressing the end portions thereof, is distinguished by said solar cell and said protective frame being respectively provided with penetrating holes, and being mutually fastened by engaging members penetrating through said holes. Said engaging members preferably have an external diameter a at least equal to 5 mm in a portion exposed from the solar cell module, and a ratio a/b, to the shaft diameter b in said penetrating hole, at least equal to 1.2.

More preferably, said engaging member is composed of an eyelet having a penetrating hole in the center.

The present invention improves the strength by fastening the solar cell and the protective frame therefor with an engaging member passing through the penetrating hole, in comparison with the conventional structure in which fastening relies solely on the adhesive material. Strong fastening is achievable even with a combination of materials difficult to adhere with an adhesive material, such as a resin-sealed solar cell and a protective frame composed of resin.

Fastening with a higher strength can be achieved by the use of an engaging member, having an external diameter of at least 5 mm in a portion exposed from said solar cell module and a ratio a/b to the shaft diameter b in said penetrating hole at least equal to 1.2.

Also, said engaging member is preferably composed of an eyelet, having a penetrating hole in the center, whereby said hole can be utilized, for example, for passing a rope after the completion of the solar cell module, and the fastening of said module can be facilitated.

Also the foregoing objects can be attained, according to the present invention, by a solar cell module which is provided, on the internal faces of the frame grooves, with projections coming into contact with the edge portion, other than end faces, of the laminate member, wherein the width of said grooves corresponding to the positions of said projections is smaller than the thickness of the edge portion of said laminate member.

Because of said smaller width of the grooves, the edge portion inserted into said grooves is locally pressed in the areas coming into contact with said projections, whereby the moisture intruding from the end faces of the edge portion of the laminate member into the interior of said edge portion does not proceed further beyond the thus pressed portions.

BRIEF DESCRIPTION OF THE DRAWINGS

FIG. 3 is a schematic cross-sectional view of a solar cell module of the present invention;

FIGS. 4A and 4B are a schematic views of an engaging member shown in FIG. 3;

FIGS. 19, 20, 21A and 21B are schematic cross-sectional views of solar cell modules constituting other embodiments of the present invention;

DETAILED DESCRIPTION OF THE PREFERRED EMBODIMENTS

In the following there will be given a detailed explanation of a photovoltaic device employed as the solar cell in the present invention.

Figure 27:
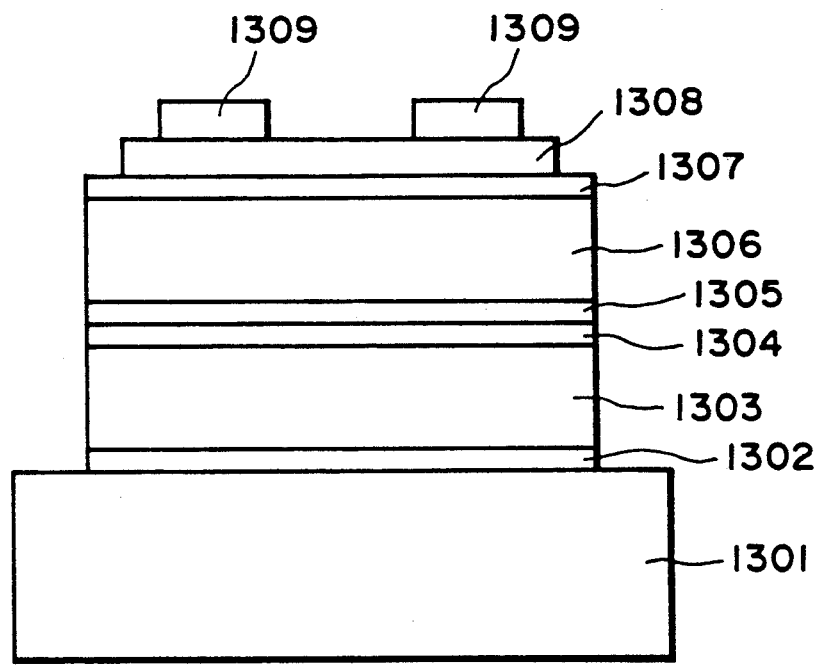
FIG. 27 is a schematic cross-sectional view of a photovoltaic device adapted for use in the present invention.

FIG. 27 is a schematic cross-sectional view of the photovoltaic device, in which a substrate 1301 with a conductive surface can be composed, for example, of a conductive substrate such as stainless steel, aluminum, copper or carbon sheet, or of a glass substrate or a plastic sheet bearing thereon a transparent conductive film such as of ITO (indium tin oxide), $SnO_2$, $In_2O_3$, or ZnO. Although not illustrated, there may be further provided a conductive surface layer, for example of Ti, Cr, Mo, W, Al, Ag, or Ni.

On said substrate 1301 there is provided a bottom photovoltaic cell consisting of an N-layer 1302, an I-layer 1303, and a P-layer 1304, and further provided thereon is a top photovoltaic cell consisting of an N-layer 1305, an I-layer 1306, and an N-layer 1307.

A transparent electrode 1308, employed in the solar cell of the present invention, can be composed, for example, of $In_2O_3SnO_2$, $In_2O_3$-$SnO_2$, ZnO, $TiO_2$, $Cd_{2\%}Sn_4$, or a crystalline semiconductor layer with a high concentration of impurity doping, and can be formed for example, by evaporation by resistance heating, electron beam evaporation, sputtering, spraying, CVD, or impurity diffusion. Grid electrodes 1309 are provided thereon.

The potting material for resin sealing of the solar cell device of the present invention can be composed, for example, of ethylene-vinyl acetate copolymer, polyvinylbutyrol, or silicone resin, but other materials may also be employed for this purpose.

The covering material for covering the solar device is required to have a good light transmitting property and resistance against ultraviolet light or ozone, and is composed, for example, of a fluorinated resin film or silicone resin, but other materials may also be employed for this purpose.

The protective frame, for compressing and protecting the end portion of the solar cell module of the present invention, can be composed, for example, of polyvinyl chloride or synthetic rubber in consideration of weather and impact resistance. However, polyvinyl chloride is preferred in consideration of weather resistance and ease of molding, and soft polyvinyl chloride is particularly preferred in order to provide the solar cell module with flexibility. On the other hand, if mechanical strength is required, a metallic material is preferred.

The material for the projection and engaging member to be employed in the present invention is not particularly limited, but is selected in consideration of weather resistance, impact resistance, and resistance to seawater. For example, there may be employed a metallic member such as an eyelet, rivet, or screw, or a thermofusible resinous molded member of polypropylene, melamine resin, or hard polyvinyl chloride. Among these, the eyelet is preferred in consideration of safety, fastening strength, and cost. On the other, if increased strength is required in combination with simplicity of preparation, said member is preferably integrated with the frame.

The semiconductor materials constituting the aforementioned N, I, and P layers are preferably composed of amorphous, polycrystalline, or microcrystalline materials. Specific examples of such materials include semiconductors of the group IV of the periodic table, such as silicon, germanium, silicon-germanium, and silicon carbide, and compound semiconductors such as $CuInSe_2$, CdS, GaAs, and ZnSe.

The aforementioned layer of Ti, Cr, Mo, W, Al, Ag, or Ni can be formed, for example, by evaporation by resistance heating, electron beam evaporation, or sputtering.

The amorphous silicon constituting the PIN junction can be formed by plasma CVD employing silane gas. The polycrystalline silicon constituting a PN junction can be formed by sheet formation with fused silicon, and the compound semiconductor junction such as $CuInSe_2$/CdS can be formed by electron beam evaporation, sputtering, or electrodeposition.

EXAMPLE 1

FIG. 3 is a schematic cross-sectional view of the solar cell module of the present invention, wherein there are shown a solar cell device 105 formed on a conductive substrate; a resinous covering material 110 for sealing said solar cell device 105; a resin-sealed solar cell module 101; a flexible resinous protective frame 102; and an engaging member 104 for mechanically fastening together the sealed solar cell module 101 and the protective frame 102.

FIG. 4 shows that the details of the engaging member 104 in a plan view and a cross sectional view along a line 4—4'. Said member 104 of the present embodiment has a portion exposed from the solar cell module with an external diameter a at least equal to 5 mm, and a ratio a/b to the shaft diameter b in the penetrating hole at lease equal to 1.2.

In the present embodiment, the protective frame 102 may be easily dislodged from the engaging member 104 if the external diameter a thereof is less than 5 mm, or if the ratio a/b is less than 1.2.

Said engaging member 104 preferably has an external diameter a at lease equal to 5 mm, but it is more preferably at least equal to 7 mm. Also the ratio a/b of said diameter to the diameter of the shaft passing through the penetrating hole is preferably at least equal to 1.2, but said ratio is more preferably at least equal to 1.5.

Also, the end 105a of the solar cell device 105 is preferably positioned inside the internal end 102a of the protective frame 102.

EXAMPLE 2

Figure 5:
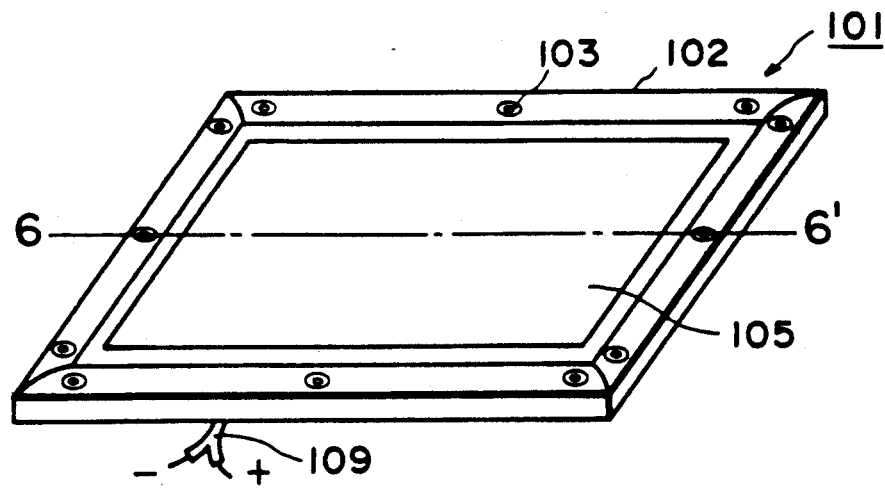
FIG. 5 is a schematic perspective view of a solar cell module of the present invention.
Figure 6:
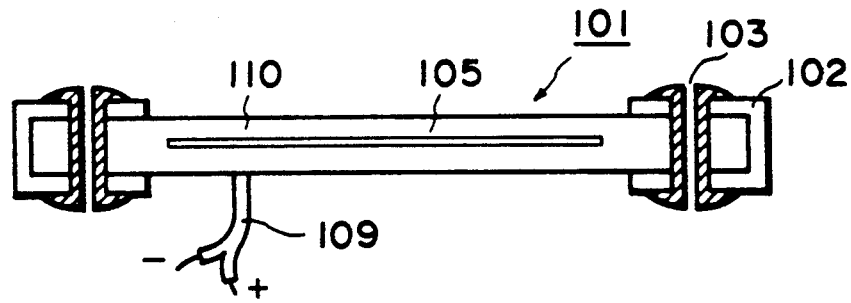
FIG. 6 is a schematic cross-sectional view of a solar cell module constituting another embodiment of the present invention.

FIG. 5 is an external perspective view of the solar cell module of the present example, and FIG. 6 is a cross-sectional view along a line 6—6' in FIG. 5.

In FIGS. 5 and 6 there are shown resin 110 for sealing a solar cell device 105; a resin-sealed solar cell module 101; a protective frame 102; 103 serving as engaging members; and a lead wire 109.

In the following there will be given a detailed explanation of the manufacturing steps and materials of the solar cell module of the present example. Said module consists of a serial connection of plural solar cell devices as shown in FIG. 7.

Figure 7:
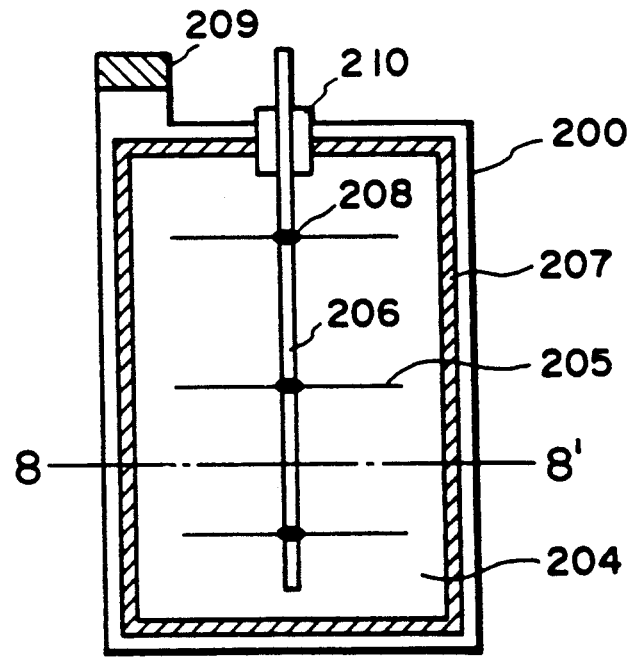
FIG. 7 is a schematic plan view showing an example of the photovoltaic device adapted for use in the present invention.
Figure 8:
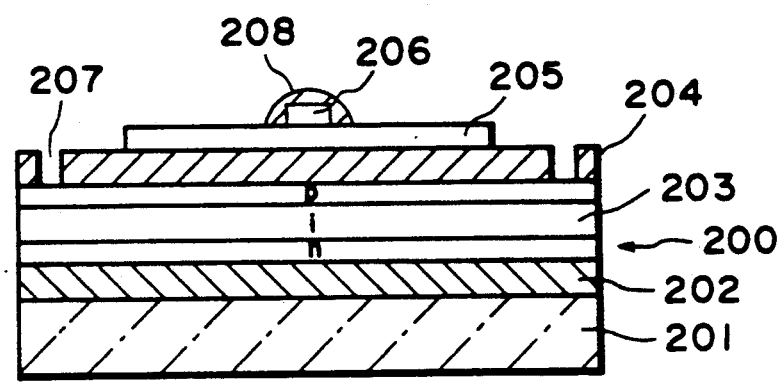
FIG. 8 is a cross-sectional view along a line 8—8' in FIG. 7.

FIG. 7 is a schematic plan view of a solar cell device 200 before serial connection, and FIG. 8 is a cross-sectional view showing the laminar structure along a line 8—8' in FIG. 7.

In FIGS. 7 and 8 there are shown a stainless steel substrate 201; an Al-Si layer 202; a non-monocrystalline silicon photoelectric layer 203 with a PIN structure; an ITO layer 204; Ag electrodes 205; a tin-plated copper bus bar 206; a device isolation area 207; adhesive silver ink 208; an exposed portion 209 of the stainless steel substrate for making serial connection; and an insulating tape 210 for preventing shortcircuiting.

The above-explained solar cell device was prepared by sputtering Al, containing 1% Si to a thickness of 5000 Å in a roll-to-roll process on a washed and rolled stainless steel substrate 201, then forming silicon layers 203 of N, I, and P types of a total thickness of 4000 Å by plasma CVD employing $SiH_4$, $B_2H_6$, and $H_2$, and forming an ITO 204 layer of 800 Å thickness by resistance-heated evaporation.

Then current-collecting electrodes 205 for the ITO layer were prepared by screen printing of silver paste. Then a bus bar electrode 206 was placed perpendicularly to the silver electrodes, and adhesive silver ink 208 was placed at the crossing points, thereby connecting said silver electrodes 205 with the bus bar electrode 206.

In this example, seven solar cell devices shown in FIG. 7 were serially connected. The output voltage was 6 V.

Figure 9:
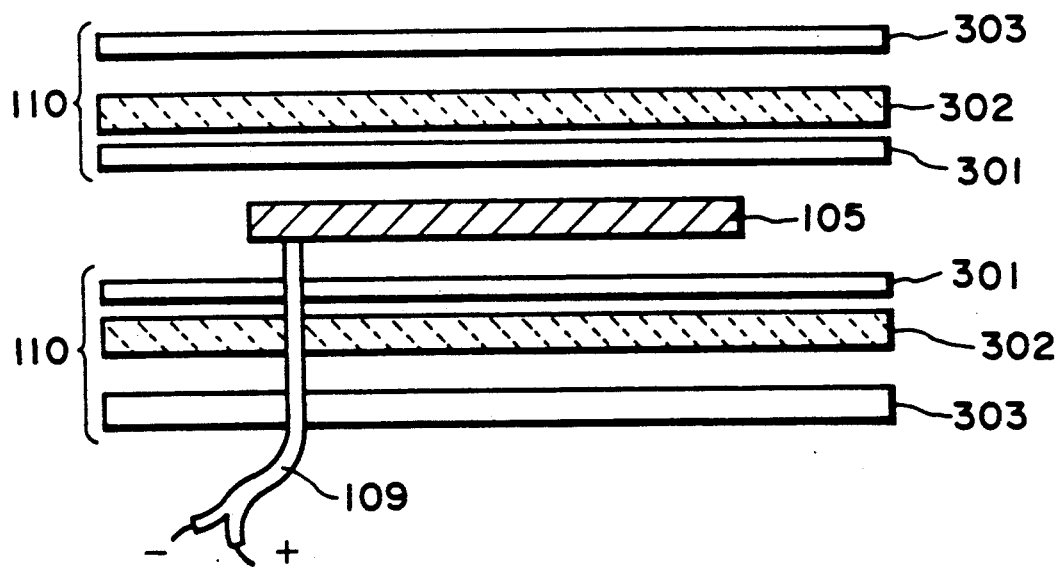
FIG. 9 is an exploded view showing the structure of a covered solar cell adapted for use in the present invention.
Figure 10:
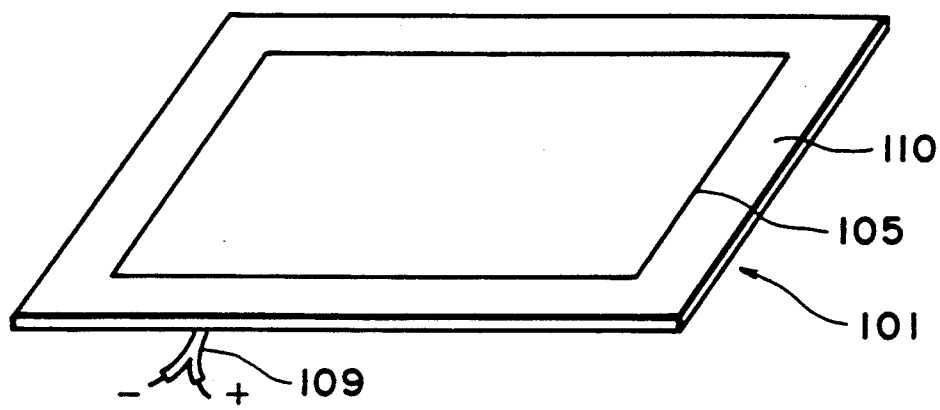
FIG. 10 is a schematic perspective view of a solar cell module of the present invention.

Then the serially connected solar cell devices were sealed as shown in FIG. 9. FIG. 10 schematically shows the solar cell after vacuum lamination. In FIGS. 9 and 10 there are shown serially connected solar cell devices 105; glass fiber layers 301 for limiting the resin flow; ethylene vinyl acetate (EVA) resin layers 302; fluorinated resin layers 303; and a lead wire 109 connected to the solar cell.

The resin sealing was conducted by fusing the EVA resin at 140 C with a vacuum laminator. The face of the fluorinated resin, to be adhered to the EVA, was plasma treated in advance.

Figure 11:
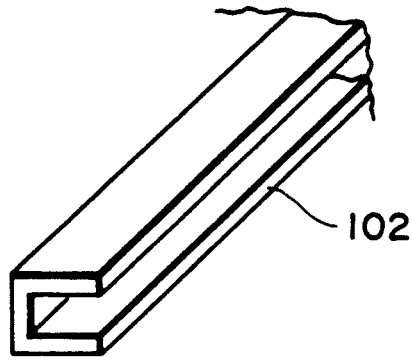
FIG. 11 is a schematic perspective view of a frame adapted for use in the present invention.

Then a protective frame 102, molded in a U shaped channel form with soft polyvinyl chloride, as shown in FIG. 11, was mounted on the end portion of the thus vacuum laminated solar cell. In this operation, the mounted portion was temporarily adhered by silicone adhesive.

Then holes for eyelets were opened in the solar cell and protective frame 102, and twelve eyelets 103 with an external diameter of 7 mm and a shaft diameter of 4 mm were installed as shown in FIG. 6.

The solar cell module of this example, prepared as explained above, was subjected to a tensile test. In this test, the protective frame 102 was repeatedly given a tensile test. In this test, the protective frame 102 was repeatedly given a tensile force of 5 kg for 5 seconds, and the change in appearance of the solar cell module was observed. The tensile force was applied 100 times, and the obtained results are shown in Table 1.

REFERENCE EXAMPLE

Figure 1:
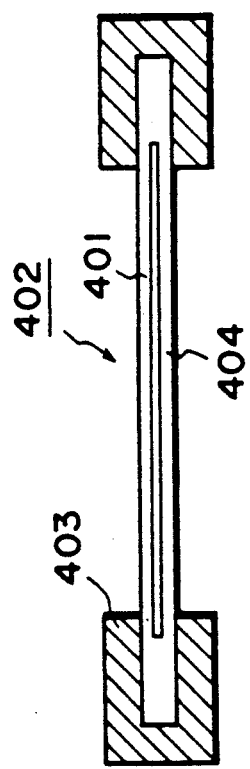
FIGS. 1 and 2 are schematic cross-sectional views of conventional solar cell modules.
Figure 2:
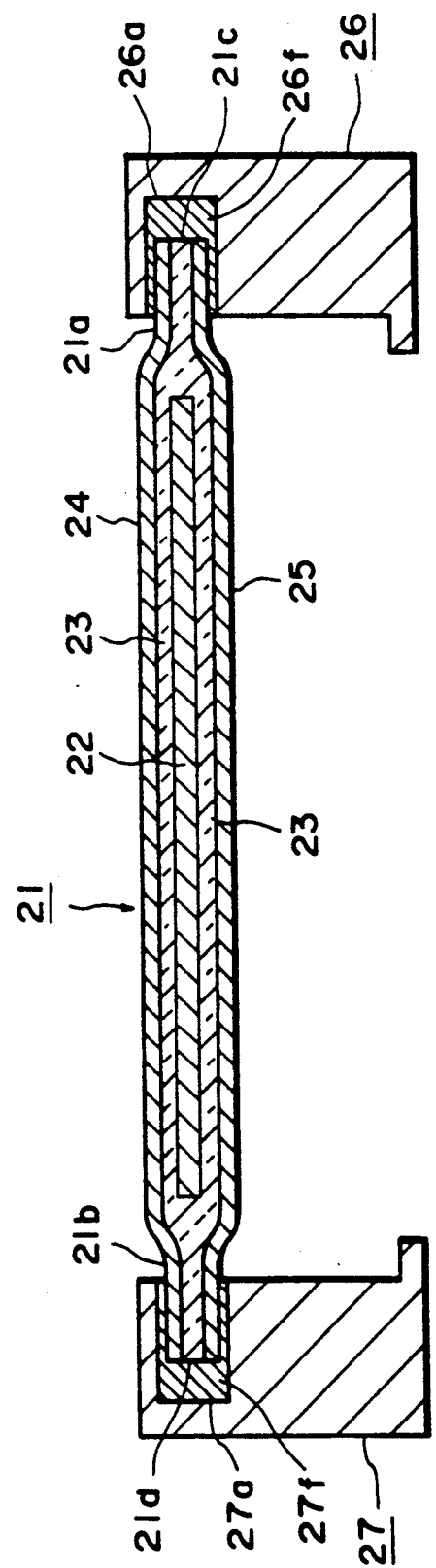

The reference example employed the conventional structure shown in FIG. 1. In this structure, the preparation was conducted in the same manner as in example 1, until the vacuum lamination of the solar device 401. Then the surface of fluorinated resin was plasma treated only at the portions to be adhered to the protective frame 403 molded from soft polyvinyl chloride, and said frame 403 was mounted on the end portions of the solar cell 402 as shown in FIG. 1. During said mounting silicone adhesive was coated on the mounting portions, in order to adhere the solar cell 402 and the protective frame 403. The obtained module was subjected to a tensile test in the same manner as in example 1, and the obtained results are shown in Table 1.

EXAMPLE 3

Figure 12:
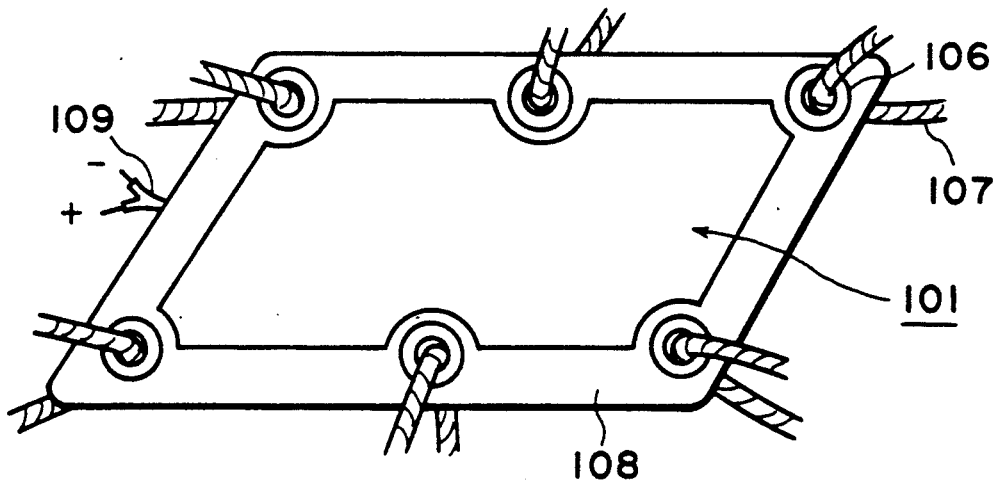
FIG. 12 is a schematic view showing an application of the solar cell module of the present invention.

FIG. 12 is an external perspective view of example 3 of the present invention, wherein there are shown a resin-sealed solar cell 101; eyelets 106; strings 107 for fastening the solar cell module; a protective frame 109; and a lead wire 109.

The solar cell module of the present invention is safe in use, as it is flexible and without a rigid frame such as of metal. For this reason, said solar cell module can be used on a yacht or in camping. For these applications, holes are generally required for passing strings therethrough for mounting.

In this example, the eyelets with penetrating holes for passing said strings therethrough also serve as the engaging members for fixing the protective frame provided at the end portion of the solar cell.

The example shown in FIG. 12 was prepared in the same manner as example 1, except for the size of the eyelets 106 and the form of the protective frame 108 composed of polyvinyl chloride.

The eyelets 106 employed in this example had an external diameter of 23 mm, a shaft diameter of 14 mm, and a height of 6 mm. Said eyelets allow passage of the ropes ordinarily used on a yacht.

The form of the protective frame 108 composed of polyvinyl chloride was varied according to the size of the eyelets 106.

The solar cell module of the present example was also subjected to the tensile test explained above, and the obtained results are shown in Table 1.

EXAMPLE 4

In this example, a solar cell module was prepared in the same structure and by the same process as in Example 1 shown in FIGS. 5 and 6, except that the external diameter of the eyelets was selected as 3 or 5 mm and the ratio a/b of the external a to the shaft diameter b was selected as 1.8, and was subjected to a tensile test in a similar manner. The obtained results are shown in Table 1.

EXAMPLE 5

In this example, a solar cell module was prepared and tensile tested in the same manner as in the example 1 shown in FIGS. 5 and 6, except that the external diameter of the eyelets was set at 7 mm and the ratio a/b of the external diameter a to the shaft diameter b of the eyelets was varied in the range of 1.0–1.8. The obtained results are shown in Table 1.

Table 1 shows the results obtained in the examples 1–4 and in the reference example. Five samples A–E were prepared under the same conditions described in each of said examples and reference example, but the quality showed certain fluctuations because of manual preparation of the samples.

Table 1 shows the number of repeated applications of tensile force required until the protective frame was dislodged from the solar cell module. In the Examples 1 and 2, the protective frame was not dislodged from the module after 100 cycles of tensile force.

On the other hand, in the reference example, the dislodging of the protective frame took place within 10 cycles in all five samples. This result proved that the present invention significantly improved the performance of the solar cell module.

Also, the results of the Example 3 indicate that the eyelets are particularly effective when the external diameter a is equal to or larger than 5 mm.

Also, the results of Example 4 indicate that the eyelets are particularly effective when the ratio a/b of the external diameter a to the shaft diameter b is equal to or larger than 1.2.

As will be apparent from the foregoing, the solar cell modules of the Examples 1-5, in which the resin-sealed solar cell and the resinous protective frame are fixed by engaging members passing through the penetrating holes provided in these components, are characterized by excellent reliability, long service life; and increased flexibility, as they are free from dislodging of the protective frame even under an external force.

Also, secure mechanical strength can be obtained by the use of engaging members which have an external diameter at least equal to 5 mm in portions exposed from the solar cell module and a ratio of said external diameter to the diameter of a shaft portion passing through the penetrating holes, equal to or larger than 1.2.

Also, the engaging member can be composed of an eyelet having a penetrating hole therein, whereby said hole can be used for passing strings or support members for fastening or mounting the solar cell module thereby fixing the module. It is therefore rendered possible to simplify the steps of manufacture, and to increase the ratio of the photoelectric conversion area within the solar cell module, thus improving the conversion efficiency per unit area.

said output terminals are withdrawn from suitable positions on the end faces of the laminate member 1.

Frames 6, 7, for example of aluminum, for supporting the laminate member 1, have an identical structure. Therefore, the following explanation will be concentrated on the frame 6 illustrated at the right-hand side.

The frame 6 is provided with a slit-shaped groove 6a extending perpendicularly to the plane of drawing, and, on the mutually opposed internal faces 6b, 6c of said groove 6a, there are respectively provided projections 6d, 6e which are in mutually opposed positions and extend continuously from an end of the groove 6a to the other. The width of the groove 6a, or the distance between the internal faces 6b and 6c, is larger than the thickness of the edge portion 1a of the laminate member 1, while the distance between the peaks of the projections 6d and 6e is smaller than said thickness. In a gap between the groove 6a and the edge portion 1a inserted therein beyond the projections 6c, 6d, there is a filler material 6f composed, for example, of silicone rubber.

Within the edge portion 1a, the surface protecting member 4 and the rear face protecting member 5, coming into contact with the projections 6d, 6e, are locally pressed and distorted by said projections, and the adhesive material 3 sandwiched between said protecting members is also pressed. As a result, moisture entering from the end face 1c of the laminate member 1 into the interior of the edge portion 1a cannot intrude the interior beyond said pressed portion.

The projections 6d, 6e are preferably formed without pointed ends, for example, spherically, in order to facilitate the insertion of the edge portion 1a and in order not to damage the surface protecting material 4 and the rear face protecting material 5 even after prolonged pressing thereon. Said projections 6d, 6e need not necessarily be continuous from an end of the groove 6a to the other,

TABLE 1

Number of cycles of repeated tensile force application until dislodging of protective frame from solar cell module.
"No change" indicates absence of dislodging after 100 cycles.

| | Example 1 | Ref. ex. | Example 2 | Example 3 | | Example 4 | | | |
|---|---|---|---|---|---|---|---|---|---|
| | | | | a = 3 mm | a = 5 mm | a/b = 1.0 | a/b = 1.2 | a/b = 1.5 | a/b = 1.8 |
| A | no change | 4 | no change | 10 | no change | 7 | no change | no change | no change |
| B | no change | 2 | no change | 8 | 65 | 12 | 48 | no change | no change |
| C | no change | 1 | no change | 8 | 81 | 4 | 94 | no change | no change |
| D | no change | 1 | no change | 15 | no change | — | — | — | — |
| E | no change | 1 | no change | 12 | no change | — | — | — | — |

EXAMPLE 6

Figure 13:
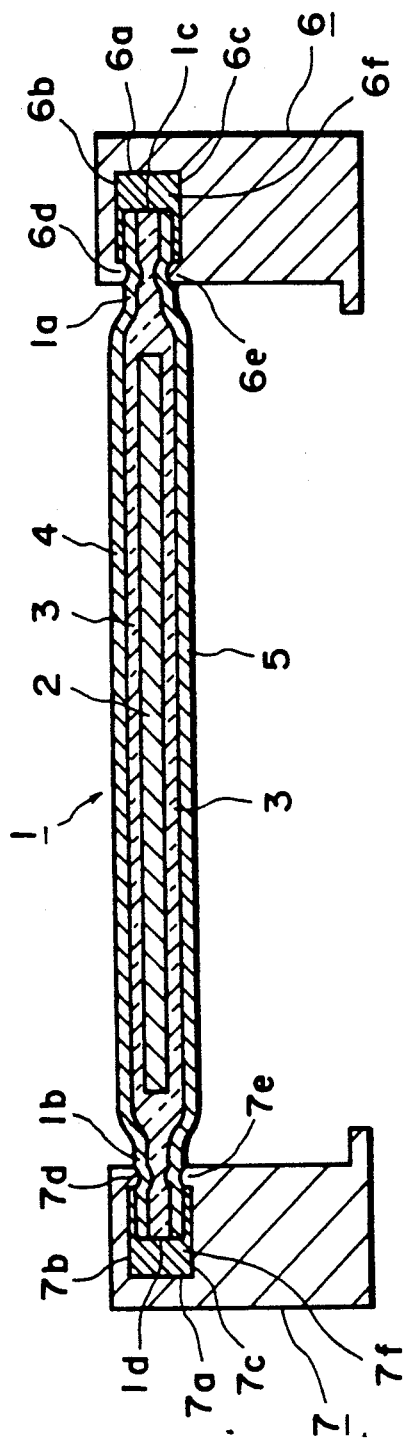
FIGS. 13, 14, 15A and 15B are schematic cross-sectional views of solar cell modules constituting other embodiments of the present invention.

FIG. 13 is a schematic cross-sectional view of the principal portion of a solar cell module constituting a example of the present invention.

In a laminate member 1 constituting a solar cell module, the light-receiving face (upper face in the drawing) of a solar cell device 2 composed, for example of amorphous silicon, is covered, via an adhesive material 3, by a sheet-like surface protecting material composed of transparent resin, and the bottom (lower) face is also covered, via an adhesive material 3, by a sheet-like bottom face protecting material 5. Said coverings are provided by vacuum lamination, whereby the solar cell device 2 is hermetically sealed inside the laminate member 1. Said laminate member 12 is cut, for example, in a rectangular form at positions outside the solar cell device 2, and the cut faces constitute the end faces 1c, 1d of the laminate member 1. The wirings and output terminals of the solar cell device 2 are not illustrated, but but may be intermittently provided. Said projections 6d, 6e may be formed as separate members and mounted on the frame 6. The material of the projections 6d, 6e and/or the frame 6 is not limited to aluminum but can be any other material as long as it can facilitate the insertion of edge portion 1a and can press the edge portion 1a with a constant pressure over a prolonged period.

EXAMPLE 7

Figure 14:
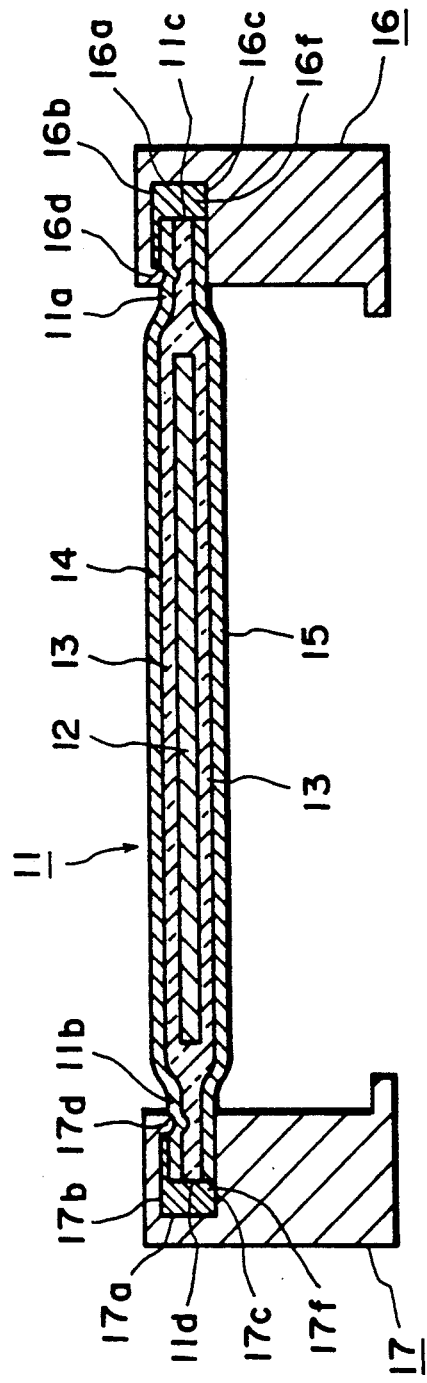

FIG. 14 is a schematic cross-sectional view of the principal part of a solar cell module, constituting a seventh example of the present invention.

The structure of this example is the same as that of example 6, except that the grooves 16a, 17a of the frames 16, 17 are respectively provided with projections 16d, 17d only on one internal face 16b, 17b of each groove. In FIG. 14, components equivalent to those in FIG. 13 are represented by the same symbols added by 10.

In the following, there will be explained an experiment of placing the solar cell modules of the present invention and the conventional solar cell modules under high humidity and measuring the shortcircuiting of the solar cell devices resulting from moisture intrusion.

EXAMPLE 8

A solar cell device was prepared by laminating, on a stainless steel substrate, amorphous silicon films of N, I, P, N, I, and P types in succession by RF glow discharge, then vacuum evaporating an ITO film as the transparent electrode, and finally printing silver paste as the grid electrodes. Thirteen units of such device, each 30×9 cm, were serially connected.

Said stainless steel substrate was composed of SU430 of a thickness of 0.2 mm, the surface of which was annealed at ca. 1100° C. in ammonia gas.

The above-mentioned lamination of amorphous silicon films was conducted in the following manner. A raw material gas, for example for an N-type amorphous silicon film, was introduced into a discharge zone in a vacuum chamber in which the substrate was placed in advance, and the discharge was induced by controlling the pressure in the chamber at about 2 Torr and supplying the electrodes of the discharge zone with high-frequency electric power, thereby decomposing said gas and depositing an N-type amorphous silicon film on the substrate. Amorphous silicon films of N, I, P, N, I, and P types were deposited in succession on the substrate, by repeating the above-explained procedure. The raw material gases for the amorphous silicon film were $Si_2H_6$, $H_2$, and $PH_3$ for the N-type; $Si_2H_6$ and $H_2$ for the I type; and $SiH_4$, $H_2$ and $Bf_3$ for the P-type. The substrate temperature during the deposition of said film was 350° C. for the N- and I-types, and 300° C. for the P-type.

The vacuum evaporation of said transparent electrode was conducted in the following manner, employing a 50-50 alloy of indium and tin.

Oxygen gas was introduced at a pressure of ca. 0.003 Torr into a chamber in which the substrate with laminated amorphous silicon films and a crucible filled with said alloy were placed in advance, and a current was supplied to a tungsten wire wound around said crucible to fuse said alloy, thereby depositing indium tin oxide onto the surface of the amorphous silicon films laminated on the substrate. The substrate temperature was controlled at 225° C. The material of the transparent electrode is not limited to the indium tin oxide employed in this example, but may be composed of other materials, such as indium oxide. The transparent electrode may also be formed by sputtering, instead of vacuum evaporation.

In the following, there will be described the laminate member 1 containing therein the solar cell device 2 thus prepared. The adhesive 3 was composed of sheet-like EVA (ethylene-vinyl acetate copolymer) which was relatively easily thermosettable. The surface protecting material 4 was composed of Tefzel (trade name of DuPont de Nemours, Inc.), a sheet-like transparent fluorinated resin with a thickness of 100 μm. The rear face protecting member 5 was composed of a Tedlar (trade name of DuPont de Nemours) which is a white fluorinated resin, different from the surface protecting material and covered with aluminum foils on both sides. The rear face protecting material 5, sheet-like adhesive 3, solar cell device 2, sheet-like adhesive 3, and surface protecting material 4 were superposed in this order, subjected to vacuum lamination in a vacuum laminator at ca. 150° C., and cut at positions about 2 cm outside the periphery of the solar cell device 2, whereby the laminate member 1 of rectangular shape was obtained. The cut end faces 1c, 1d were not particularly treated.

In the following are described frames 6, 7. For each laminate member 1, there were prepared four frames, each having a pair of mutually opposed projections 6d, 6e, 7d, 7e as shown in example 6 and matching the thickness and length of the four edge portions 1a, 1b of the laminate member 1. The paired projections formed in the groove of each frame were continuous from one end of said frame to the other, so that, when the edge portions of four sides of the laminate member 1 were inserted in the respective frames, said end portions were continuously pressed over the entire periphery by the paired projections on said frames. When the four edge portions of four sides of laminate member 1 are inserted into the grooves of the frames 6,7, the ends of neighboring frames were mutually fixed by a screw.

The solar cell module of the present invention was prepared by inserting the edge portions 1a, 1b of four sides of the laminate member 1 into the grooves 6a, 7a of the four frames 6, 7, filling the gap between the edge portions and the grooves with silicone rubber pottant 6f, 7f, pressing each frame in the portion of the groove thereof from the light-receiving side and from the rear side, connecting the ends of neighboring frames with screws, mounting a waterproof terminal box on a part of the frame at the side of the rear face protecting material 5, positioning the output terminals of the solar cell device drawn from an end face of the laminate member 1 in said terminal box, and leaving thus obtained module for three days for completely drying said pottant. During the insertion of said end portions, it was confirmed that the surface protecting material 4 and the rear face protecting material 5 of the edge portion on each side of the laminate member 1 were recessed by about 0.2 mm by the pressure of the paired projections 6d, 6e, 7d, 7e. Ten such solar cell modules were prepared in this manner.

Separately, there were prepared 10 conventional solar cell modules, which were identical, in structure and manufacturing process, with the modules of the present invention, except that the groove of each frame lacked the paired projections.

The ten solar cell modules of the present invention and the ten conventional modules were placed under a high humidity, in a commercial weather testing apparatus, having a chamber of 1.5×1.0×1.0 m and capable of controlling the relative humidity in said chamber within a range from 0 to 100%

The ten solar cell modules of the present invention and the ten conventional modules were horizontally positioned, with the surface protecting material 4 at the top, in said chamber of the weather testing apparatus, with a mutual spacing of 10 cm. The output terminals of each solar cell device 2 were left open in the waterproof terminal box. In such state, the modules were left for 1000 hours at a temperature of 50° C. and a relative humidity of 85% in said chamber, without light irradiation of the solar cell devices.

After standing for 1000 hours, each solar cell module was taken out from the weather testing apparatus, and, after the dew and moisture on the surface were wiped off with a cloth, the module was subjected to measurement of electrical performance at room temperature, employing a commercial artificial solar light generator, emitting artificial solar light of AM 1.5 global, 1000 mW/cm$_2$.

In the 10 conventional modules, a reduction of shunt resistance to 1/10 or lower in comparison with that before the high humidity exposure or a shortcircuiting of the entire module was observed in 6 units. On the other hand, in the 10 modules of the present invention, a similar shortcircuiting was observed in 1 unit, but the remaining 9 units were intact. The effect of the paired projections 6d, 6e, 7d, 7e was proved in this manner.

EXAMPLE 9

In this example, in the grooves 6a, 7a of the frames 6, 7 employed in the solar cell modules of the present invention, the mutually opposed projections 6d, 6e, 7d, 7e were formed in intermittent manner, with each continuous length of 10 cm and a spacing of 10 cm. Other conditions were the same as in the example 8.

In the experimental results, in 10 conventional solar cell modules, a reduction of shunt resistance of the solar cell device to 1/10 or lower in comparison with that prior to exposure to high humidity or a shortcircuiting of the entire solar cell module was observed in 7 units. On the other hand, in 10 modules of the present invention, a similar reduction of shunt resistance or a shortcircuiting was observed only in 3 units. Thus the effect of the paired projections 6d, 6e, 7d, 7e was proved even when they were formed intermittently.

EXAMPLE 10

In this example, the conditions were identical with those in example 8, except that, in the groove of each frame 16 or 17 shown in FIG. 14, a projection 16d or 17d is formed continuously only on the upper internal face 16b or 17b.

In the experimental results, in 10 conventional solar cell modules, a reduction of shunt resistance of the solar cell device to 1/10 or lower in comparison with that prior to exposure to high humidity or a shortcircuiting of the entire solar cell module was observed in 7 units. On the other hand, in 10 modules of the present invention, such reduction of shunt resistance or shortcircuiting was observed only in 4 units. Thus the effect of the projection was proved even when it was formed only on one internal face of the groove of the frame.

In the above-explained examples 6 to 10, a groove or grooves formed on the internal faces of the groove of the frame locally presses a contact area of the edge portion of the laminate member, inserted into said groove, thereby preventing the intrusion of moisture, entering said edge portion from the end face thereof, into the interior beyond said pressed area, and thus improving the resistance against moisture intrusion into the interior of the laminate member. As a result, the breakdown of the solar cell device resulting from such moisture intrusion can also be prevented.

In the following, there will be explained the method of installation of the solar cell modules shown in the foregoing examples 1-10.

The solar cell is usually installed on a rack fixed on the ground or on the roof of a building, or adhered to the wall of a building. In the case of installation on the roof, the solar cell may also be integrated with the roofing material and placed on the roof without the rack.

As an example of such method, a solar cell device sealed in resin sheets or EVA is adhered with an adhesive material, to a rear face metal protecting plate. The end portions of said protecting metal plate are folded upwards to form sealing portions for said solar cell, then a plurality of such sealing portions are adhered to the roof surface, and a batten-seam is placed over the end portions, parallel to the slanting direction of the roof, for protecting the seal portions of the solar cells and the end faces of the protecting metal plates. This method has an advantage of dispensing with the cost of rack, in comparison with an installation with a rack on the roof.

The conventional solar cell modules, particularly those in which the solar cell device is vacuum laminated with surface protecting materials consisting of sheet-like transparent resin, are usually trimmed to a predetermined shape by cutting the surface protecting material, adhesive material, and rear face protecting material at positions outside the solar cell device. It is therefore necessary to suitably treat the end portions formed by such cutting, in order to protect the internally sealed solar cell device and electric circuits from the stress, water, and moisture (vapor) originating from the ambient conditions.

If the seal portion of the solar cell is adhered, with an adhesive material, to a rear face metal protecting plate, the end face of said seal portion may be treated in the following manner, as the aforementioned frame is absent in this case.

There was first conceived a method of protecting the end portion by covering it with an adhesive material or a pottant such as silicone rubber, prior to the adhesion of the seal portion of the solar cell to the rear face metal protecting plate. However, the surface protecting material of said seal portion, enclosing a solar cell device employing a conductive substrate such as a stainless steel substrate, is often composed of fluorinated resin or the like, for which effective adhesives or pottants are not known. The fluorinated resin is used for such surface protecting material because of its high light transmittance and high durability to stress caused by the ambient conditions. The fluorinated resin also provides low dust deposition and a high water repellant property, required for the surface protecting material, but this fact also signifies the absence of a suitable adhesive therefor. Since the fluorinated resin and EVA cannot be adhered to satisfactorily, the adhesion if often improved by applying a corona discharge to the entire adhered surface of the fluorinated resin. However, the corona discharge, if applied to the entire top surface of the fluorinated resin, will deteriorate the dust and water repellant properties mentioned above. Also such corona discharge, if applied only to the end portion, will require an increased precision of the sealing operation and increase the process cost.

Another conceivable method consists of heating the end portion, thereby fusing and expelling the adhesive material, such as EVA, from the seal portion, and thermally adhering the surface protecting resin material and the rear face protecting resin material under pressure, prior to the adhesion of the seal portion of the solar cell to the rear face metal protecting plate. However, such thermal adhesion, experimented with by the present inventors at various temperatures, has not provided sufficient adhesive strength.

As explained in the foregoing, various difficulties arise in the treatment of the end portions, in the case where the seal portion of the solar cell is to be adhered to the rear face metal protecting plate.

In consideration of the foregoing, another object of the present invention, different from those of the foregoing examples 1-10, in a solar cell module which includes plural seal portions of solar cells, each including a solar cell device and a rear face metal protecting plate serving as a support member, and a batten-seam member for protecting vertically positioned ones among the neighboring end portions of said rear face metal protecting plates when they are installed on a roof, wherein said seal portions are integrated with the roofing material, is to prevent the deformation or destruction of said end portions of the seal portions by external stress or in intrusion of water vapor from said end portions to the solar cell device, thereby avoiding failure of the solar cell device or shortcircuiting or internal wirings caused by such intruding water vapor.

The above-mentioned object can be achieved, according to the present invention, by a solar cell module which includes plural seal portions of solar cells, each including a solar cell device and a rear face metal protecting plate, and a batten-seam member for protecting vertically positioned ones among the neighboring end portions of said rear face protecting metal plates when they are installed on a roof and in which said seal portions are integrated with the roofing material, wherein said rear face protecting metal plate is provided, at the end portions thereof, with slit-shaped grooves formed by folding said metal plate.

The solar cell module of such structure allows prevention of deformation or destruction of the end portions of said solar cell seal portions by external stress and intrusion of water vapor from said end portions to the solar cell device, thereby avoiding failure of said device or shortcircuiting or internal wirings caused by such intruding water vapor.

EXAMPLE 11

Figure 15:
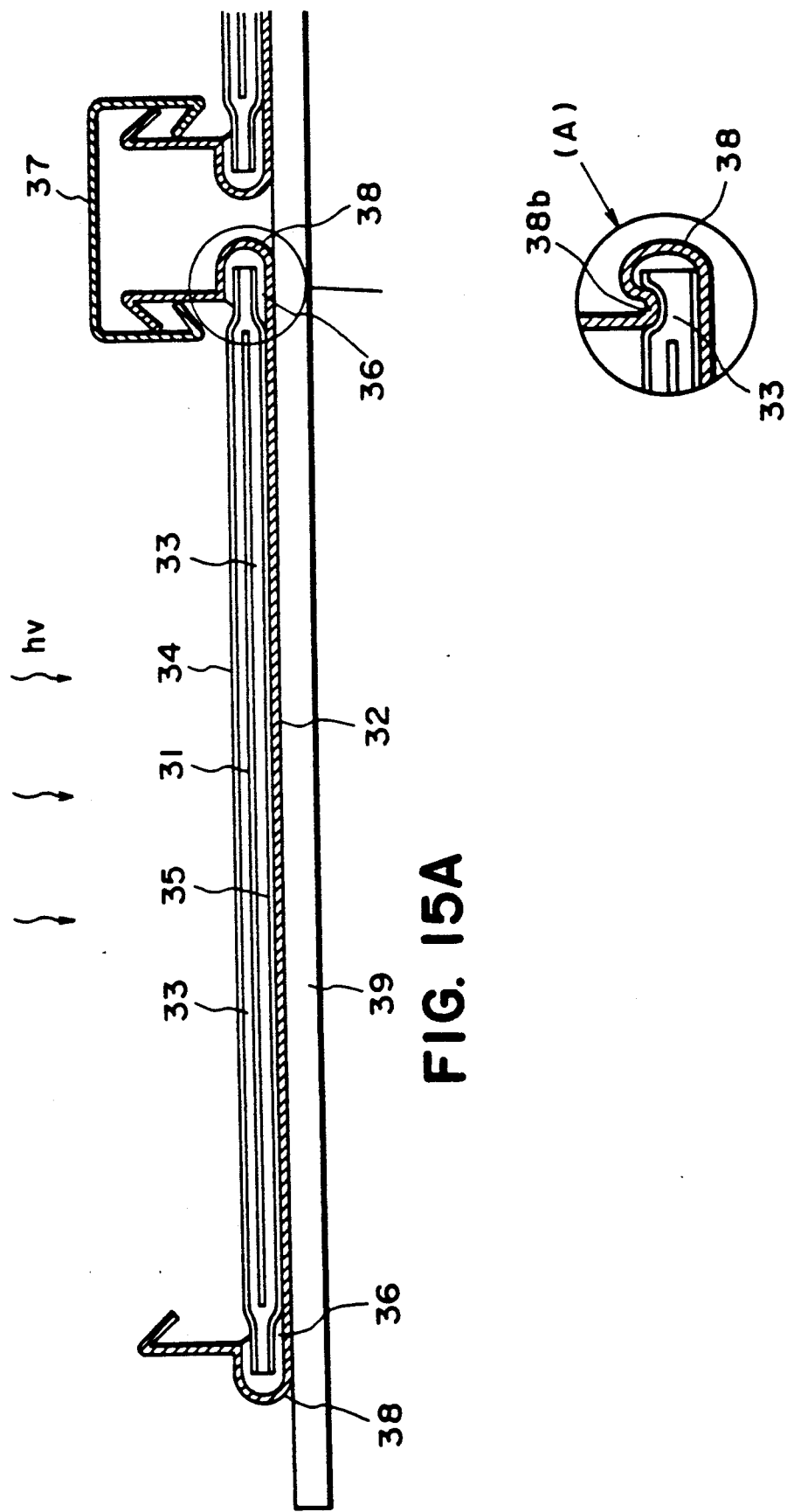

FIG. 15 is a schematic cross-sectional view of an amorphous solar cell module, best representing the feature of the present example. There are illustrated an amorphous solar cell device 31; a rear face metal protecting plate 32; an adhesive layer 33; a front surface protecting material 34; a rear face protecting material 35; pottant 36; a batten-seam member 37; and a slit-shaped groove 38 formed by folding said metal plate. The solar light hv enters the module from above. The amorphous solar cell device 31 is composed, for example, of a serial connection of a plurality of devices each formed, on a stainless steel substrate, by laminating amorphous silicon films of N, I, P, N, I, and P types in succession by RF glow discharge, then evaporating indium tin oxide as a transparent electrode, and finally printing silver paste as grid electrodes.

The solar cell module of this example is formed by inserting the seal portion of the solar cell into the slit-shaped groove 38, formed by folding the protecting metal plate 32 at the end portion thereof. In FIG. 15, the wirings and output terminals of the solar cell device are omitted.

The form and dimension of said slit-shaped groove 38 are preferably so selected that said groove does not induce deformation nor damage of the end portion of the seal portion at the insertion thereof or after a prolonged inserted state and that a suitable pottant 36 can easily fill the gap between the groove 38 and the end portions. As an example, the groove 38 is formed deeper, as shown in FIG. 15, than the inserted length of the end portion thereby leaving a gap for filling with the pottant, but such configuration is not limitative.

Also said groove 38 is preferably formed without interruption over the entire length of the longer and shorter sides of the end portions of the solar cell seal portions.

The rear face metal protecting plate 32 is preferably composed of a material whose surface is treated so as to have sufficient durability required for the roofing material against ambient conditions and allows easy formation of the slit-shaped groove 38 by folding. An example of such material is galvanized steel plate, but each example is not limitative.

A non-limitative example of the adhesive layer 33 is EVA. Also, a non-limitative example of the upper surface protecting material 34 is fluorinated resin. In this example, the sealing is achieved by vacuum lamination of sheet-shaped fluorinated resin, but the surface protecting material 34 may also be formed, for example, by coating a liquid fluorinated resin.

The rear face protecting material 35 is composed of a material capable of electrically insulating the solar cell device from the rear face metal protecting plate 32. A non-limitative example of such material is sheet-shaped nylon.

Non-limitative examples of the pottant 36 are silicone rubber and butyl rubber.

Sealing is achieved more preferably by forming a projection 38b in the groove 38, as in the foregoing examples 6–10 (see (A) in FIG. 15B). Also, penetrating holes may be provided in the protecting materials 34, 35 as in examples 1–5.

In the present example, the solar cell module prepared by vacuum lamination of the amorphous silicon solar cell device 31 with the surface protecting material 34, rear face protecting material 35, and adhesive layer 33 was left in a high humidity condition, and was subjected to an investigation of frequency of failures such as peeling of end portions of the solar cell seal portions, and failure of the solar cell devices and shortcircuiting of the entire module caused by water vapor intrusion.

The amorphous solar cell 31 employed in the example was prepared, on a stainless steel substrate, by laminating amorphous silicon films of N, I, P, N, I, and P types in succession by an RF glow discharge method, then evaporating indium tin oxide as the transparent electrode, and printing silver paste as a current-collecting grid electrode, and 13 such cells, each ca. 30×9 cm, were connected serially.

The adhesive layer 33 consisted of sheet-shaped EVA, while the front surface protecting material 34 consisted of sheet-shaped Tefzel of a thickness of 100 μm, and the rear face protecting material 35 consisted of a sheet in which an aluminum foil was sandwiched between white Tedlar sheets.

The above-mentioned materials were superposed in succession, from the bottom, in the order of the rear face protecting material 35, adhesive layer 33, amorphous silicon solar cell device 31, adhesive layer 32, and front surface protecting material 34, and were laminated at 100° C. in a vacuum laminator. The obtained laminate member was cut into a rectangular form at positions of the solar cell seal portions, and failure of the solar cell devices and shortcircuiting of the entire module caused by water vapor intrusion.

The amorphous solar cell 31 employed on this example was prepared, on a stainless steel substrate, by laminating amorphous silicon films of N, I, P, N, I, and P types in succession by an RF glow discharge method, then evaporating indium tim oxide as the transparent electrode, and printing silver paste as a current collecting grid electrode, and 13 such cells, each ca. 30×9 cm, were connected serially.

The adhesive layer 33 consisted of sheet-shaped EVA, while the front surface protecting material 34 consisted of sheet-shaped Tefzel of a thickness of 100 μm, and the rear face protecting material 35 consisted of a sheet in which an aluminum foil was sandwiched between white Tedlar sheets.

The above-mentioned materials were superposed in succession, from the bottom, in the order of the rear face protecting material 35, adhesive layer 33, amorphous silicon solar cell device 31, adhesive layer 33, and front surface protecting material 34, and were laminated at 100° C. in a vacuum laminator. The obtained laminate member was cut into rectangular form at positions 2 cm outside the external periphery of the solar cell device. The cut faces were not particularly treated.

Figure 16:
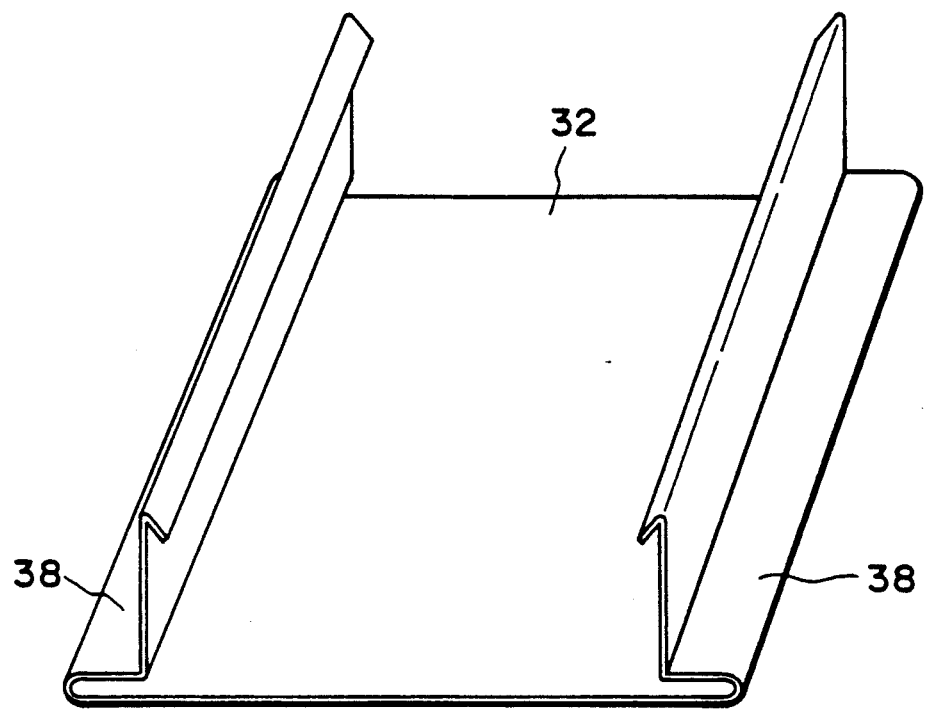
FIG. 16 is a schematic perspective view of a support member adapted for use in the present invention.
Figure 17:
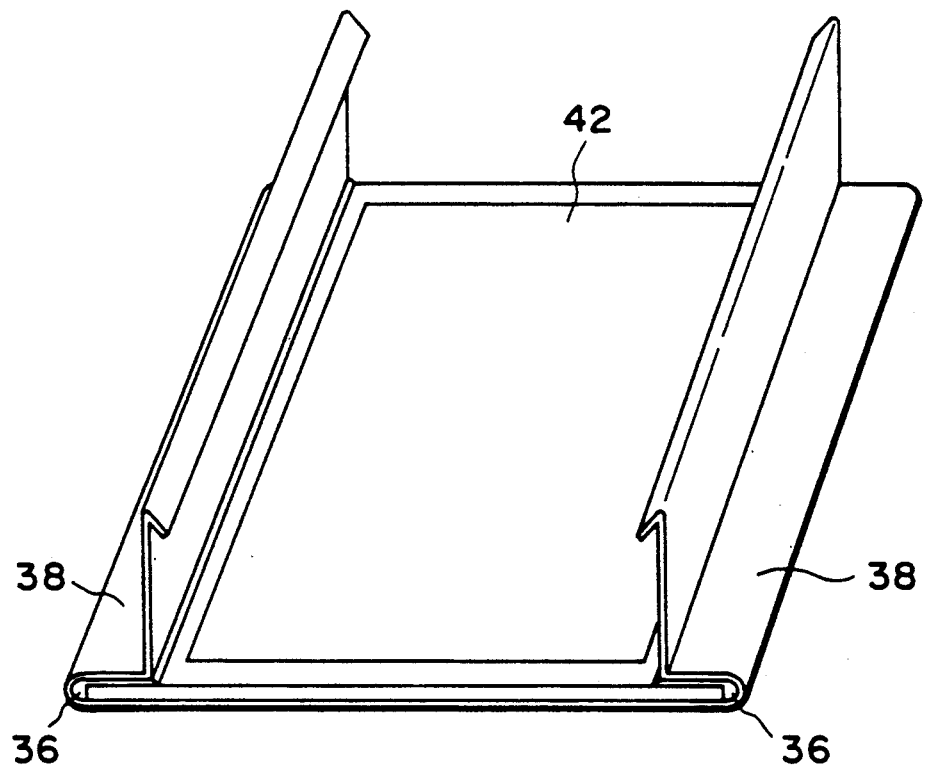
FIGS. 17 and 18 are schematic views of showing assembling steps of the solar cell module of the present invention.
Figure 18:
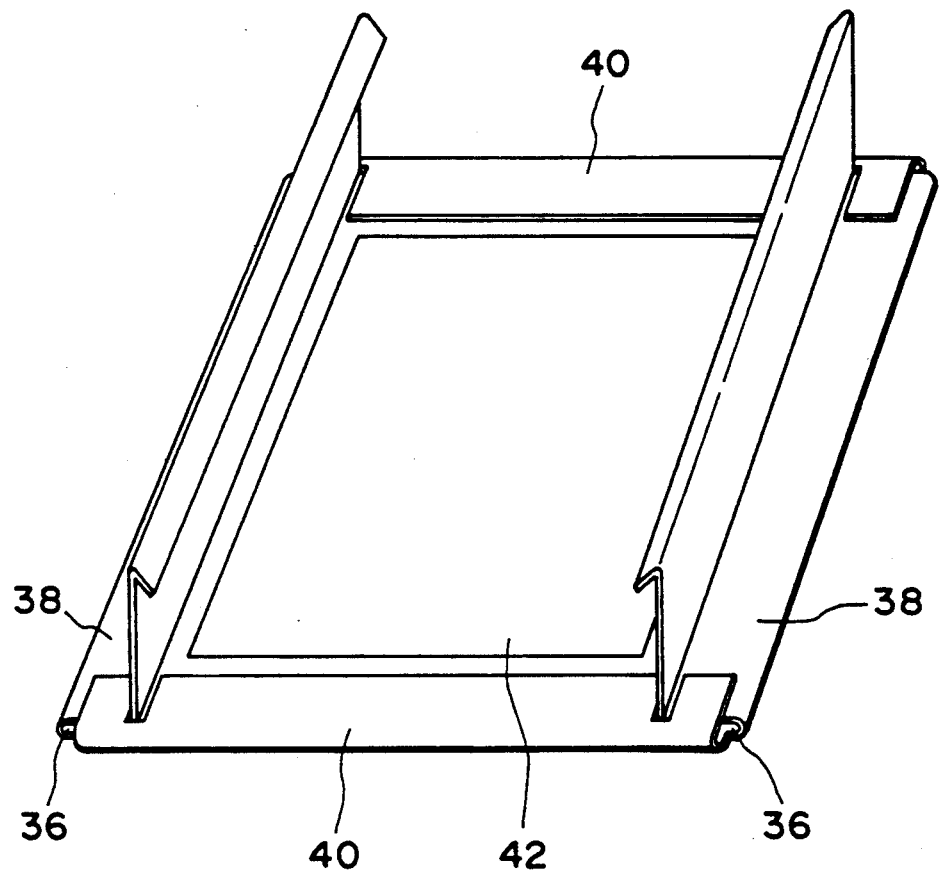

The rear face metal protecting plate 32, consisting of a galvanized steel plate of a thickness of ca. 0.3 mm and having a weather resistant treatment on one side thereof, was cut into a size of 1.5×0.45 m and folded in the following manner. At first the mutually opposed longer sides of the steel plate were folded over the entire width to form slit-shaped grooves 38 of a width of ca. 4 mm and a depth of 1 cm, as shown in FIG. 15A. Then, each end portion of about 4 cm was folded upwards, and finally each end portion of about 1 cm was folded diagonally downwards. FIG. 16 is a schematic perspective view showing the thus folded metal plate 32, and FIG. 17 is a schematic perspective view showing a state in which the seal portions of the solar cell were inserted, on a trial basis, into said rear face metal protecting plate 32. Then the mutually opposed shorter sides were similarly folded to form slit-shaped grooves 40 of a width of ca. 4 mm and a depth of ca. 1 cm. During said folding operation, in order to avoid interference with the end portions of the already folded longer sides, slits were made in advance in the portions of the shorter sides to be folded. FIG. 18 is a schematic perspective view of the completed state of the rear face protecting metal plate 32.

Separately, as a conventional example, a rear face protecting metal plate without the slit-shaped groove 38 was prepared with a steel plate the same as explained above, having a size of ca. 1.5×0.39 m. More specifically, the end portions of said steel plate were at first folded upwards for a length of ca. 4 cm, then folded diagonally downwards for a length of ca. 1 cm.

The batten-seam member 37 was formed, with a galvanized steel plate of a thickness of ca. 0.3 mm, similar to the rear face protecting metal plate 32, by folding so as to obtain a square U-shape cross section in which the ends were further folded back, as shown in FIG. 15. The square U-shape had a length of ca. 4 cm on each side, and the folded end portions had a length of ca. 1 cm.

After silicone rubber pottant is filled in the slit-shaped grooves 38, 40 of the metal plate 32, epoxy adhesive was coated on the rear face of the seal portions of the solar cell obtained by laminating the amorphous solar cell device 31 as explained above, then the edge portions of longer and shorter sides of said seal portions were inserted into said grooves 38, 40 and the light-receiving surface of the solar cell was pressed. Finally, the output terminals (not shown) were mounted on the seal portion, and a waterproof terminal box, for protecting said terminals, was mounted on the rear side of the module. The obtained module was then let to stand for 3 days until the filler 36 and the adhesive completely solidified. Two units thus prepared, each including the solar cell seal portions and the rear face protecting metal plate 32, were installed with a mutual spacing of ca. 3 cm between the longer sides, on a wooden sheet of a size of 1.5×0.8 m and a thickness of 2 cm, simulating a roof covering 39, and said spacing was covered by the batten-seam member prepared in advance, whereby the solar cell module of the present invention was completed. Ten modules were prepared in this manner.

Also, as a conventional example, aqueous adhesive was coated on the rear face of the seal portions of a solar cell, obtained by laminating a similar amorphous solar cell device, and said solar cell was adhered to a rear face protecting metal plate without the slit-shaped grooves 38, 40. Output terminals were mounted on the seal portion, and a water-proof terminal box was mounted on the rear side of the module. Two units thus prepare were installed with a mutual spacing of ca. 3 cm between the longer sides, on a wooden sheet of a size of 1.5×0.8 m and a thickness of 2 cm, simulating a roof covering 39, and said spacing was covered by the batten-seam member prepared in advance, whereby the solar cell module of the conventional example was completed. Ten modules were prepared in this manner.

The above-explained solar cell modules of two kinds were subjected to a comparative test for investigating the frequency of peeling of end portions of the seal or the failure of the solar cell module resulting from water vapor intrusion from the end portions. The above-explained 10 solar cell modules were placed under a high humidity condition in a commercial weather testing apparatus, and the rate of failure was investigated. Said weather testing apparatus had a chamber of 1.5×1.0×1.0 m, and was capable of controlling the relatively humidity in said chamber within a range of 0-100%. In order to reproduce the state of outdoor use of the solar cell module, the temperature in the chamber was fixed at about 50° C.

In order to reproduce the actual state of outdoor use of the solar cell module, it is necessary to irradiate the module with light. However, as already well known, the amorphous silicon solar cell incurs so-called photodeterioration, so that the electrical performance of the solar cell module is deteriorated by the light irradiation. In this experiment, in order to separate the influence of said photodeterioration of the module from that due to water vapor intrusion which is important in the present invention, no light irradiation of the solar cell modules in said chamber was conducted. Also the output terminals were left open and maintained in the waterproof terminal box.

The 10 solar cell modules each of the two kinds were horizontally placed, with the light-receiving face upwards, in said chamber of the weather testing apparatus, with a mutual spacing of 10 cm, and left to continuously stand for 1000 hours under a temperature of 50° C. and a relative humidity of 85%.

After 1000 hours, the modules were taken from the apparatus, and, after wiping off the dew and moisture with a cloth, subjected to measurement of the electrical performance, employing a commercial large artificial solar light generator. The artificial solar light was AM 1.5 global, 100 mW/cm$^2$, and the measurement was conducted at room temperature.

In the 10 solar cell modules lacking slit-shaped grooves 38, 40, peeling of the end portions of the seal, reduction of shunt resistance to 1/10 or less in comparison with the state prior to the testing, or a shortcircuiting was observed in 5 modules. On the other hand, in the 10 solar cell modules with the slit-shaped grooves 38, 40, similar phenomena were observed only in one module. These results proved the effect of slit-shaped grooves 38, 40 in the rear face metal protecting plate.

EXAMPLE 12

Figure 19:
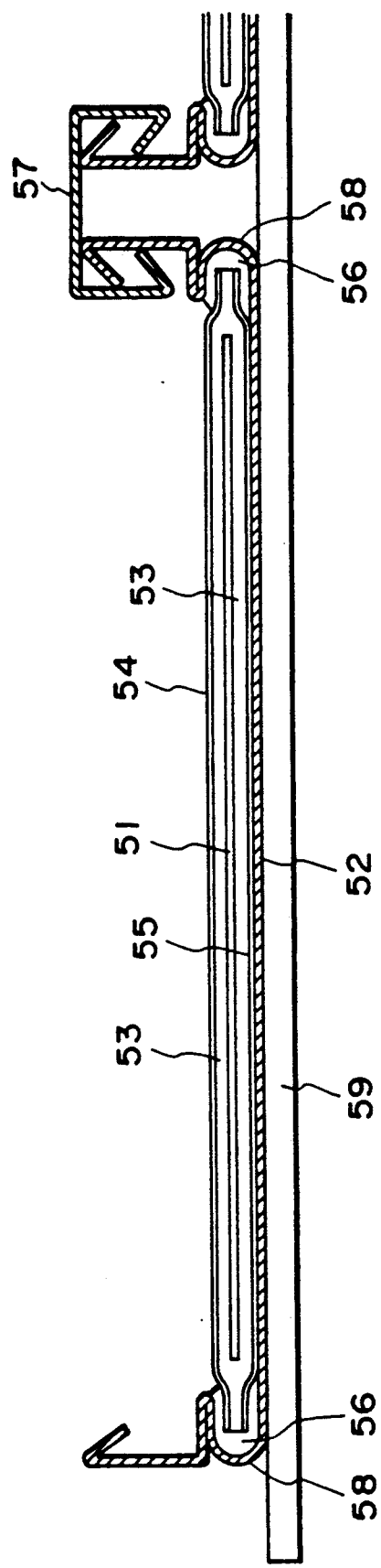

In this example, an experiment was conducted to confirm the effect, when the slit-shaped groove 48 on the rear face metal protecting plate had a folded structure as shown in FIG. 19. In this configuration, the vertical end portion of said metal plate is positioned at the external end of the slit-shaped groove 58, so that the distance of neighboring metal plates can be reduced at the module installation and the width of the batten-seam member can also be reduced. Consequently, the shadow cast by the batten-seam member onto the light-receiving face of the solar cell device is reduced, and, as a result, an increase in the total output of the solar cell module can be expected.

Also in this example, the rear face metal protecting plate 52 was formed with a galvanized steel plate of a thickness of ca. 0.3 mm, having a weather resistant treatment on one side thereof and having a size of 1.5 ×0.45 m, by folding in the following manner. At first, both ends of the mutually opposed longer sides of said rectangular steel plate were folded over the entire width to form slit-shaped grooves 58 of a width of ca. 4 mm and a depth of 1 cm as shown in FIG. 19. Then each end portion of the steel plate was folded upwards, and further folded back so as to contact the outside of said slit-shaped groove. Then, about 5 mm from said folded-back portion, said end portion was folded upwards for a distance of ca. 3 cm, and finally folded diagonally downwards for a distance of ca. 1 cm. Also, the mutually opposed shorter sides were folded, in the end portions, as in the example 11, thereby forming slit-shaped second grooves of a thickness of ca. 4 mm and a depth of ca. 1 cm. During said folding operation, slits were made in advance in the folded portions of the shorter sides, in order to avoid interference with the already folded upward portions of the ends of the longer sides.

The above-described folded structure permits a reduction of the distance of the neighboring metal plates 52 at the module installation, thereby reducing the width of the batten-seam member. Consequently the shadow cast by the batten-seam member onto the light-receiving face of the solar call device is reduced, whereby an increase in the total output of the solar cell module can be expected.

The method of preparation and the materials for the solar cell device of the present example are identical with those in the example 11. Also the method of serial connection of the devices, the materials and dimensions of the front surface protecting material 54, rear face protecting material 55 and adhesive layer 53, and the method and conditions of lamination are the same as those in the example 1. Furthermore, as in example 1, the cut faces of the laminate member were not treated.

The rear face metal protecting plate 52 of the present example was prepared by the above-explained procedure, with a steel plate the same as employed in example 11.

Also, a rear face metal protecting plate of conventional type was prepared with the same material and dimensions as in example 11.

After silicone rubber pottant was filled into the slit-shaped grooves 58 and the second grooves (not shown), epoxy adhesive was coated on the rear face of the seal portions of the thus prepared amorphous solar cell in the same manner as in example 11, the edge portions of the longer and shorter sides of said seal portions were inserted into the slit-shaped grooves mentioned above, and the solar cell was simultaneously pressed from the light-receiving face thereof. Finally, output terminals were mounted on the seal portion, and a waterproof terminal box, for protecting said terminals, was mounted on the rear side of the module. The obtained structure was left to stand for 3 days until the pottant 53 and the adhesive were completely solidified. Two units thus prepared, each including the solar cell seal portions and the rear face protecting metal plate 52, were installed with a mutual spacing of ca. 3 cm between the longer sides, on a wooden sheet of a size of 1.5×0.8 m and a thickness of 2 cm, simulating a roof covering and said spacing was covered by the batten-seam member prepared in advance, whereby the solar cell module of the present invention was completed. Ten modules were prepared in this manner.

Also, as a conventional example, epoxy adhesive was coated on the rear face of seal portions of the solar cell, formed by laminating a similarly prepared solar cell device, and said solar cell was adhered on a rear face metal protecting plate without the grooves. Output terminals were mounted on the seal portion, and a protecting waterproof terminal box was mounted on the rear side of the module. Two units thus prepared, each including the solar cell seal portions and the rear face protecting metal plate, were installed with a mutual spacing of ca. 3 cm between the longer sides, on a wooden sheet of a size of 1.5×0.8 m and a thickness of 2 cm, simulating a roof covering and said spacing was covered by a batten-seam member prepared in advance, whereby the solar cell module of the conventional type was completed. Ten modules were prepared in this manner.

The 10 modules of each of the above-described two kinds were prepared, and subjected to a comparative test for confirming the effect of the present example, in the same apparatus and procedure as in example 1.

In the measurement of electrical performance after 1000 hours, in the 10 modules lacking the slit-shaped grooves 58 and the second slit-shaped grooves (not shown), peeling in the end portion, decrease of shunt resistance to 1/10 or lower in comparison with the state prior to testing, or shortcircuiting was observed in 4 modules. On the other hand, in the 10 modules provided with the slit-shaped grooves, similar phenomena were not observed. Thus, also in this example, the effect of slit-shaped grooves 58 and the second slit-shaped grooves (not shown) was proved.

EXAMPLE 13

Figure 20:
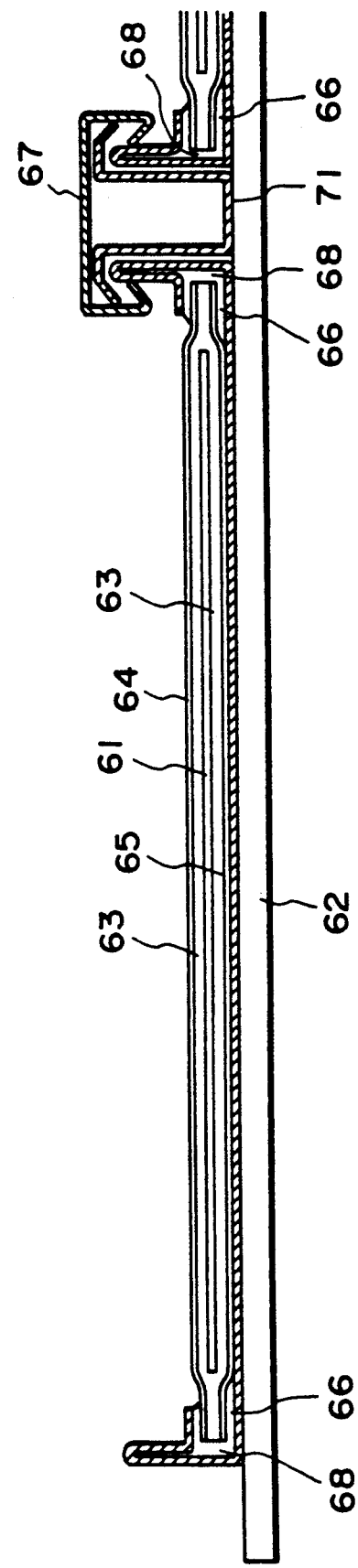

In this example, as experiment was conducted to confirm the effect, when the slit-shaped groove 68 on the rear face metal protecting metal plate had a folded structure as shown in FIG. 20. This example provides the advantage that the folding work for forming said grooves 68 is simpler than in the examples 11 and 12.

Also in this example, the rear face metal protecting plate 62 was formed from a galvanized steel plate of a thickness of ca. 0.3 mm, having a weather resistant treatment on one side thereof and a size of 1.5×0.45 m, by folding in the following manner. At first, each end of the mutually opposed longer sides of said rectangular steel plate was folded downwards over the entire width, for a length of ca. 1 cm from the end. Then the steel plate was folded upwards at a position of ca. 3.6 cm from the above-mentioned fold and further folded by 180°. Then the plate was folded upwards at a position of ca. 4 cm from side 180° folded position, thereby forming a slit-shaped groove 68 of a thickness of ca. 4 mm and a depth of 1 cm. Also, the end portions of the mutually opposed shorter sides were folded as in the example 11 to form second grooves (not shown) of a thickness of ca. 4 mm and a depth of ca. 1 cm.

The method of preparation and the materials of the amorphous solar cell device, and the method, materials, and conditions of lamination were the same as those in example 11. Ten units each of the solar cell modules with the slit-shaped grooves 68 and the second slit-shaped grooves (not shown), and the conventional modules without said grooves were thus prepared. In the present example, however, a fastening member 71 of the cross section shown in FIG. 20 was employed for fastening the batten-seam member.

These modules were subjected to a comparative test for confirming the effect of the present example, with the same apparatus and procedure as in examples 11 and 12.

In the measurement of electrical performance of each module after 1000 hours, in the 10 modules lacking said slit-shaped grooves, peeling of the end portion of the seal portion, reduction of shunt resistance to 1/10 or lower in comparison with the state prior to testing or shortcircuiting was observed in 4 modules. On the other hand, in 10 modules with the slit-shaped grooves 68 and the second slit-shaped grooves, such phenomena were observed only in one module. Thus, also in this example, the effect of the slit-shaped grooves 68 and the second slit-shaped grooves was confirmed.

As explained in the foregoing, in a solar cell module which includes plural seal portions of solar cells, each including a solar cell device and a rear face metal protecting plate, and a batten-seam member for protecting vertically positioned ones among the neighboring end portions of said rear face metal protecting plates when they are installed on the roof and in which said seal portions are integrated with the roofing material, slit-shaped grooves are provided at the end portions of said rear face protecting metal plate by folding said metal plate, thereby preventing the peeling or damage of the end portions of the solar cell seal portions and also preventing water vapor intrusion to the seal portions, whereby breakdown of the solar cell device and shortcircuiting of internal wirings, resulting from such water vapor intrusion can be avoided.

The following examples, relating to a solar cell module which includes plural seal portions of solar cells, each including a solar cell device and a rear face protecting metal plate serving as a support member, and a batten-seam member for protecting vertically positioned ones among the neighboring end portions of said rear face protecting metal plates when they are installed on the roof and in which said seal portions are integrated with the roofing material, prevent deformation or damage of the end portions of the solar cell seal portions by external stress and prevent water vapor intrusion from said end portions of the solar cell device, thereby avoiding failure of the solar cell device or shortcircuit of internal wirings resulting from such water vapor intrusion.

In the following examples there are provided such solar cell modules as explained above, which are characterized by that, at the end portions of said rear face protecting metal plate, slit-shaped grooves are formed by said metal plate and separate members. In the solar cell module of the above-mentioned configuration, said slit-shaped grooves protect, in cooperation with pottant material, the end portions of the solar cell seal portions, thus preventing peeling or damage of said end portions and water vapor intrusion from said end portions to the solar cell device, thereby avoiding failure of solar cell device and shortcircuiting of internal wirings resulting from such water vapor intrusion.

EXAMPLE 14

FIGS. 21A and 21B show schematic cross sectional views of an amorphous solar cell module and best represents the feature of the present example. There are shown an amorphous solar cell device 31; a rear face metal protecting plate 32; an adhesive layer 33; a front surface protecting material 34; a rear face protecting material 35; a pottant 36; a batten-seam member 37; slit-shaped grooves 38; and groove-forming members 43. The solar light hv enters from above. The solar cell device 31 is composed, for example, of a serial connection of devices each formed, on a stainless steel substrate, by laminating amorphous silicon films of N, I, P, N, I, and P types in succession by RF glow discharge, then evaporating indium tin oxide as a transparent electrode, and finally printing silver paste as a grid electrode.

The solar cell module of this example is formed by inserting the seal portions of the solar cell in the slit-shaped grooves 38, formed at the end portions of the rear face metal protecting plate 32 by means of said plate 32 and groove forming members 43. In FIG. 21A, the wirings and output terminals of the solar cell device are omitted.

The form and dimension of said slit-shaped groove 38 are preferably so selected that said groove does not induce deformation nor damage on the end portion of the seal portion during the insertion thereof or after a prolonged inserted state and that suitable pottant 36 can be easily filled into the gap between the groove 38 and the end portion. As an example, the groove 38 is formed deeper, as shown in FIG. 21A, than the inserted length of the end portion, thereby leaving a gap for filling with the pottant, but such configuration is not limitative.

Also, said groove 38 is preferably formed without interruption over the entire length of the longer and shorter sides of the end portions of the solar cell seal portions.

The rear face metal protecting plate 32 and the groove forming member 43 are preferably composed of a material which is surface treated so as to have sufficient durability required for the roofing material against ambient conditions and permits easy folding. An example of such material is galvanized steel plate, but such example is not limitative.

A non-limitative example of the adhesive layer 33 is EVA. Also, a non-limitative example of the front surface protecting material 34 is fluorinated resin. In this example, the sealing is achieved by vacuum lamination of sheet-shaped fluorinated resin, but the surface protecting material 34 may also be formed, for example, by coating liquid fluorinated resin.

The rear face protecting material 35 is composed of a material capable of electrically insulating the solar cell device from the rear face metal protecting plate 32. A non-limitative example of such material is sheet-like nylon.

Non-limitative examples of the filler 36 are silicon rubber and butyl rubber.

Also, the groove forming member 43 may be provided with a projection engaging with a recess in the materials 34, 35 as shown in FIG. 15, or with a projection 43a inserted into a penetrating hole formed in said material 34, 35 as shown in FIG. 21(B). In this manner excellent effects can be obtained by combinations with the examples 1-10.

In the present example, the solar cell module prepared by vacuum lamination of the amorphous silicon solar cell device 31 with the front surface protecting material 34, rear face protecting material 35, and adhesive layer 33 was left in high humidity conditions, and was subjected to the investigation of frequency of failures such as peeling of end portions of the solar cell seal portions, failure of the solar cell device, and shortcircuiting of entire module caused by water vapor intrusion.

The amorphous solar cell 31 employed in this example was prepared, on a stainless steel substrate, by laminating amorphous silicon films of N, I, P, N, I, and P types in succession by an RF glow discharge method, then evaporating indium tin oxide as the transparent electrode, and printing silver paste as current collecting grid electrode. 13 units of such cell, each ca. 30×9 cm, were serially connected.

The adhesive layer 33 consisted of sheet-like EVA, while the surface protecting material 34 consisted of sheet-like Tefzel (DuPont) of a thickness of 100 μm, and the rear face protecting material 5 consisted of a sheet in which an aluminum foil was sandwiched between while Tedlar (DuPont) sheets.

The above-mentioned materials were superposed in succession, from the bottom, in order of the rear face protecting material 35, adhesive layer 33, amorphous silicon solar cell device 31, adhesive layer 33, and front surface protecting material 34, and were laminated at 100° C. in a vacuum laminator. The obtained laminate member was cut into a rectangular form at positions 2 cm outside the external periphery of the solar cell device. The cut faces were not particularly treated.

The rear face protecting metal plate 32, consisting of a galvanized steel plate of a thickness of ca. 0.3 mm and having a weather resistant treatment on one side thereof, was cut into a size of 1.5×0.45 m and folded in the following manner. Each end portion of the mutually opposed longer side of said rectangular steel plate was at first folded upward for a length of ca. 4 cm, and then the portion was folded diagonally downwards for a length of ca. 1 cm. 10 pieces of such steeply folded plate were prepared.

Figure 22:
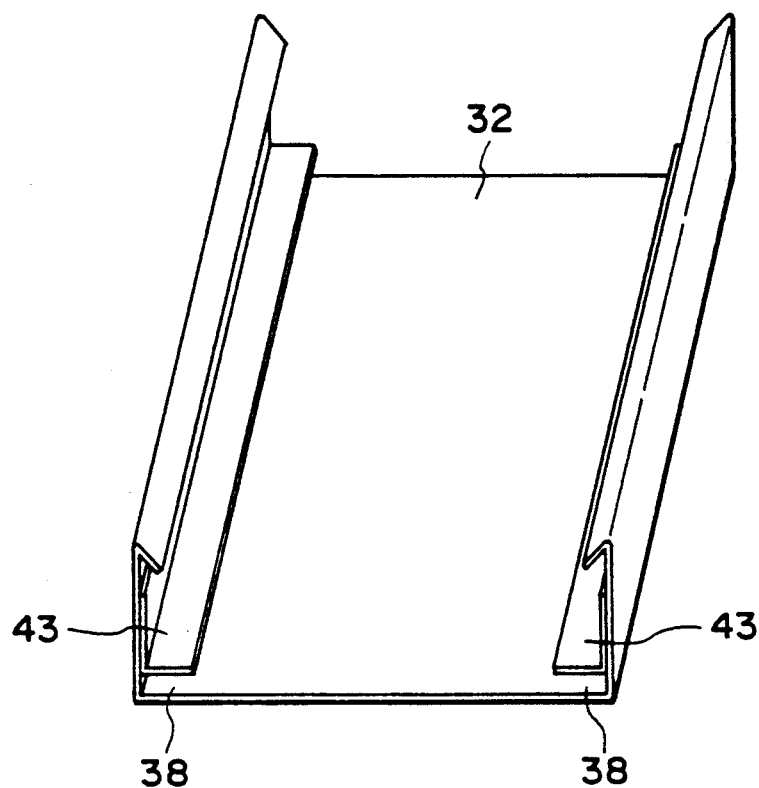
FIG. 22 is a schematic perspective view of another example of support member adapted for use in the present invention.
Figure 23:
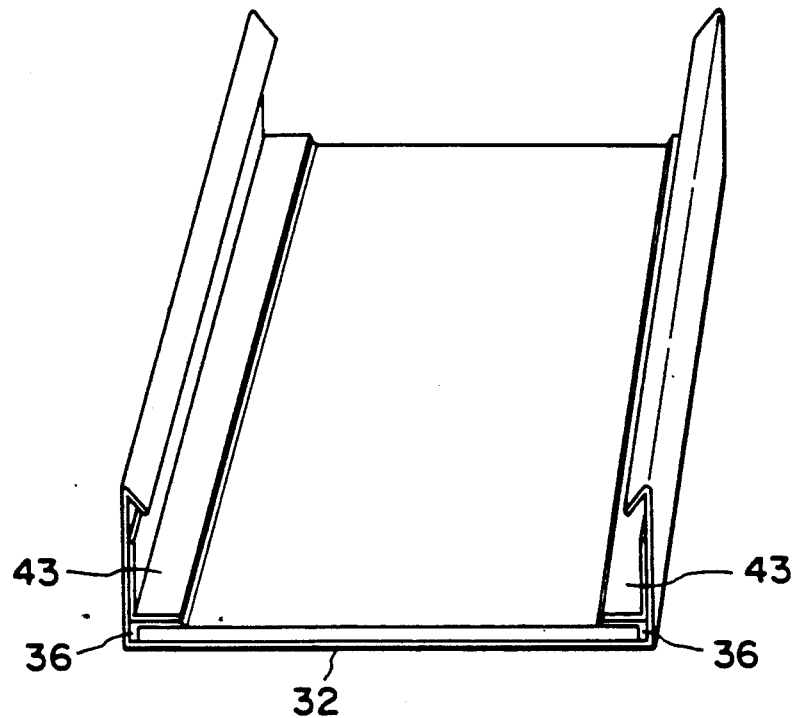
FIGS. 23 and 24 are schematic views showing assembling steps of the solar cell module of the present invention.
Figure 24:
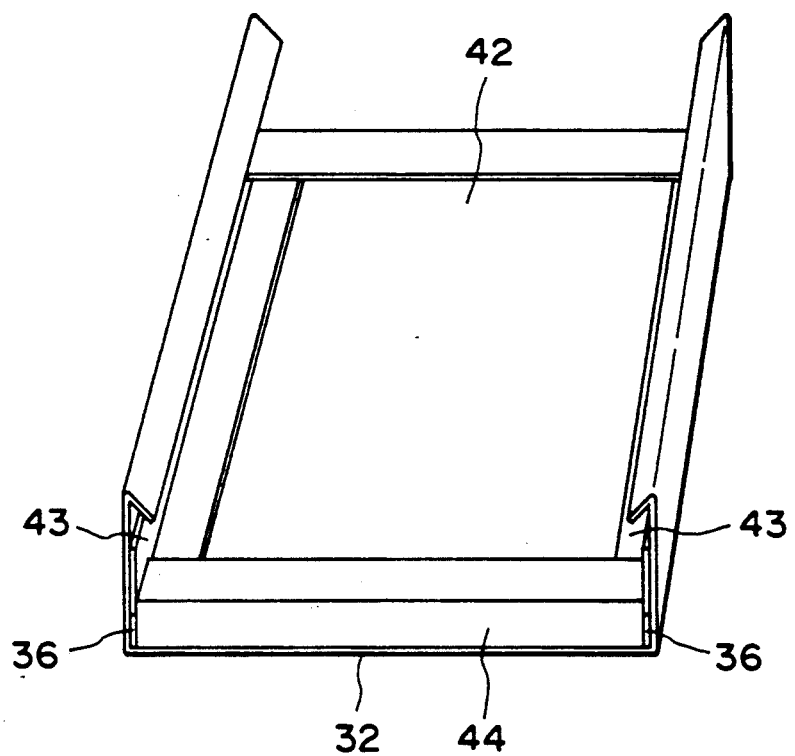

The groove forming member 43, consisting of a galvanized steel plate of thickness of ca. 0.3 mm and having a weather resistant treatment on one side thereof, was cut into a size of 1.5 m.×3 cm and folded over the entire length in such a manner that the cross section of the shorter side assumes an L-form with sides of 1 and 2 cm. 20 pieces of such member were prepared. Then said groove forming members 43 were adhered, with an adhesive material, to the rear face metal protecting plate 32, thereby forming, as shown in FIG. 21A, slit-shaped grooves 38 of a thickness of ca. 4 mm and a depth of ca. 10 mm, on the upward folded portions of the longer sides of the metal plate 32. In this example,
the groove forming members 43 were adhered by an adhesive material to the metal plate 32, but the adhesion may also be achieved by welding or soldering, or by the use of a junction member such as a grommet. FIG. 22 is a schematic perspective view of the groove forming members 43 and the rear face protecting metal plate 32 combined as explained above, and FIG. 23 is a schematic perspective view showing a state in which the seal portions of the solar cell were experimentally inserted into said slit-shaped grooves 38 formed in said metal plate 32. On the other hand, for the end portions of the mutually opposed short sides, groove forming members 44 were prepared by folding a galvanized steel plate of a thickness of 0.3 mm, having a weather resistance treatment on one side and having a size of ca. 0.32×0.02 m, over the entire length of 0.32 m so as to have an L-shaped cross section of 1×1 cm on the shorter side. Said members were adhered, with an adhesive material, to the metal plate 32 and the groove forming members 43 thereby forming slit-shaped grooves (not shown) of a thickness of ca. 4 mm and a depth of ca. 10 mm also on the ends of the shorter sides. FIG. 24 is a schematic perspective view showing the completed state of the rear face protecting metal plate 32 and the groove forming members 43, 44.

Separately, as a conventional example, the rear face protecting metal plate 32 without the slit-shaped grooves was prepared in the following manner, by folding a galvanized steel plate of a thickness of ca. 0.3 mm, having a weather resistant treatment on one side and having a size of 1.5×0.45 m. Each end of the mutually opposed longer sides of said rectangular steel plate was folded, over the entire width, upwards for a length of ca. 4 cm, and then the end portion was folded diagonally downwards for a length of ca. 1 cm. 10 units were prepared in this manner.

The batten-seam member 37 was formed, with a galvanized steel plate of a thickness of ca. 0.3 mm, similar to the rear face protecting metal plate 32, by folding so as to obtain a square U shaped cross section of which the ends were further folded back, as shown in FIG. 21. The square U-shape had a length of ca. 4 cm on each side, and the folded end portions had a length of ca. 1 cm.

After silicone rubber pottant was filled in the slit-shaped grooves at the ends of the metal plate 32, epoxy adhesive was coated on the rear face of the seal portions of the solar cell prepared as explained above, then the edge portions of longer and shorter sides of said seal portions were inserted into said grooves and the light-receiving face of the solar cell was pressed. Finally, output terminals (not shown) were mounted on the seal portion, and a waterproof terminal box, for protecting said terminals, was mounted on the rear side of the module. The obtained structure was then left to stand for 3 days until the pottant and the adhesive were completely solidified. Two units thus prepared, each including the solar cell seal portions and the rear face protecting metal plate 32, were installed with a mutual spacing of ca. 3 cm between the longer sides, on a wooden sheet of a size of 1.5×0.8 m and a thickness of 2 cm, simulating a roof covering 39, and said spacing was covered by the batten-seam member prepared in advance, whereby the solar cell module of the present invention was completed. 10 modules were prepared in this manner.

Also as a conventional example, epoxy adhesive was coated on the rear face of the seal portions of a solar cell, obtained by laminating a similar amorphous solar cell device, and said solar cell was adhered to a rear face metal protecting plate without the slit-shaped grooves. Output terminals were mounted on the seal portion, and a water-proof terminal box was mounted on the rear side of the module. Two units thus prepared were installed with a mutual spacing of ca. 3 cm between the longer sides, on a wooden sheet of a size of 1.5×0.8 m and a thickness of 2 cm, simulating a roof covering 39, and said spacing was covered by the batten-seam member prepared in advance, whereby the solar cell module of the conventional example was completed. 10 modules were prepared in this manner.

The above-explained solar cell modules of two kinds were subjected to a comparative test for investigating the frequency of peeling of end portions of the seal and failure of the solar cell module resulting from water vapor intrusion from the end portions. The above-explained solar cell modules were placed under a high humidity condition in a commercial weather testing apparatus, and the rate of failure was investigated. Said weather testing apparatus had a chamber of 1.5×1.0×1.0 m, and was capable of controlling the relative humidity in said chamber within a range of 0–100%. In order to reproduce the state of outdoor use of the solar cell module, the temperature in the chamber was fixed at about 50° C.

In order to reproduce the actual state of outdoor use of the solar cell module, it is necessary to irradiate the module with light. However, as is well known, the amorphous silicon solar cell experience so-called photodeterioration, whereby the electrical performance of the solar cell module is deteriorate by light irradiation. In this experiment, in order to separate the influence of said photodeterioration to the module from that of water vapor intrusion which is important in the present invention, light irradiation of the solar cell modules in said chamber was not conducted. Also, the output terminals were left open and maintained in the water-proof terminal box.

The solar cell modules of two kinds were horizontally placed, with the light receiving face upwards, in said chamber of the weather testing apparatus, with a mutual spacing of 10 cm, and left to continuously stand for 1000 hours under a temperature of 50° C. and a relative humidity of 85%.

After 1000 hours, the modules were taken out from the apparatus, and, after wiping of the dew and moisture with a cloth, subjected to the measurement of electrical performance, employing a commercial large artificial solar light generator. The artificial solar light was AM 1.5 global, 100 mW/cm$^2$, and the measurement was conducted at room temperature.

In 10 solar cell modules lacking slit-shaped grooves, peeling of the end portions of the seal, reduction of shunt resistance to 1/10 or less in comparison with the state prior to the testing, or shortcircuiting was observed in 6 modules. On the other hand, in 10 solar cell modules with two pairs of slit-shaped grooves, such phenomena were not observed. Thus the effect of slit-shaped grooves provided on the rear face metal protecting plate was confirmed.

EXAMPLE 15

Figure 25:
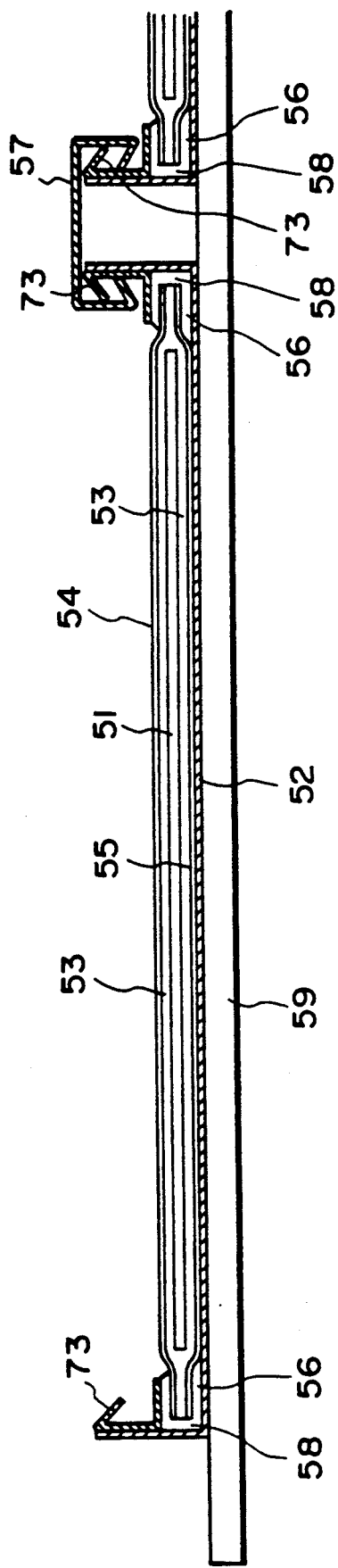
FIGS. 25 and 26 are schematic cross-sectional views of solar cell modules constituting other embodiments of the present invention.

In this example, an experiment was conducted to confirm the effect, when the slit-shaped grooves 58 on the rear face protecting metal plate had a folded structure as shown in FIG. 25. In this example, the portion supporting and fixing the batten-seam member was formed by folding an end portion of a groove forming member 73, instead of an end portion of the rear face metal protecting metal 52 as in the example 14. Such configuration provides an advantage of improving the operational efficiency and reducing the cost, since said folding operation of the supporting portion can be conducted on a relatively small groove forming member 73.

Also in this example, the rear face metal protecting plate 52 was formed with a galvanized steel plate of a thickness of ca. 0.3 mm, having a weather resistant treatment on one side thereof and a size of 1.5×0.45 m, by folding in the following manner. Each end of the mutually opposed longer sides of said rectangular steel plate was folded upwards for a length of ca. 4 cm, as shown in FIG. 21A. 10 units were prepared in this manner.

The groove forming member 73 was formed of a galvanized steel plate of a thickness of ca. 0.3 mm, having a weather resistant treatment on one side thereof and a size of 1.5 m×6 cm, by diagonally folding an end portion with a width of 1 cm over the entire length of 1.5 m, and further folding said plate over the entire length of 1.5 m so as to obtain an L-shaped cross section with sides of 1 and 2 cm. Said groove forming members 73 were prepared in 20 units. Then said groove forming member 73 was adhered, with an adhesive material, to the side of each upward folded portion at the end of the metal plate 52, so as to form a slit-shaped groove 58 on said upward folded portion, as shown in FIG. 25. The method of adhesion, conducted with an adhesive material in this example, may also be conducted by welding or soldering, or with a fastener member such as a grommet.

Also, for the ends of the mutually opposed shorter sides, groove forming members (not shown) were prepared by employing a galvanized steel plate of a thickness of ca. 0.3 mm, having a weather resistant treatment on one side thereof and a size of ca. 0.32×0.02 m, by folding over the entire length of 0.32 m so as to obtain an L-shaped cross section with sides of 1 and 1 cm. Said member was adhered, with an adhesive material, to an end of the rear face metal protecting plate 52 and the groove forming members 73, so as to form a slit-shaped groove of a thickness of ca. 4 mm and a depth of ca. 10 mm also at the end of the shorter side.

Separately, as a conventional example, a rear face metal protecting plate without the slit-shaped grooves, as in the example 14, was prepared in the following manner, with a galvanized steel plate of a thickness of ca. 03. mm, having a weather resistant treatment on one side and a size of 1.5×0.45 m. Each end of the mutually opposed longer sides of said rectangular steel plate was folded, over the entire width, upwards for a length of ca. 4 cm, and then the end portion was folded diagonally downwards for a length of ca. 1 cm, as shown in FIG. 25. 10 units were prepared in this manner.

The method of preparation and materials for the solar cell device of the present example are identical with those in the example 14. Also, the method of serial connection of the devices, the materials and dimensions of the surface protecting material 54, rear face protecting material 55 and adhesive layer 53, and the method and conditions of lamination are the same as those in the example 14. Furthermore, as in the example 14, the cut faces of the laminate member were not treated.

After silicone rubber pottant was filled into the slit-shaped grooves 58 and second grooves (not shown), epoxy adhesive was coated on the rear face of the seal portions of the thus prepared amorphous solar cell in the same manner as in the example 14, then the edge portions of longer and shorter sides of said seal portions were inserted into the slit-shaped grooves mentioned above, and the solar cell was at the same time pressed from the light-receiving face thereof. Finally, output terminals were mounted on the seal portion, and a waterproof terminal box, for protecting said terminals, was mounted on the rear side of the module. The obtained structure was left to stand for 3 days until the pottant 56 and the adhesive were completely solidified. Two units thus prepared, each including the solar cell seal portions and rear face metal protecting metal 52, were installed with a mutual spacing of ca. 3 cm between the longer sides, on a wood sheet of a size of 1.5×0.8 m and a thickness of 2 cm, simulating a roof covering, and said spacing was covered by the batten-seam member prepared in advance, whereby the solar cell module of the present invention was completed. 10 modules were prepared in this manner.

Also as a conventional example, epoxy adhesive was coated on the rear face of seal portions of the solar cell, formed by laminating a similarly prepared solar cell device, and said solar cell was adhered on a rear face metal protecting plate without the grooves. Output terminals were mounted on the seal portion, and a protecting water proof terminal box was mounted on the rear side of the module. Two units thus prepared, each including the solar cell seal portions and the rear face protecting metal plate, were installed with a mutual spacing of ca. 3 cm between the longer sides, on a wooden sheet of a size of 1.5×0.8 m and a thickness of 2 cm, simulating a roof covering, and said spacing was covered by the batten-seam member prepared in advance, whereby the solar cell module of the conventional type was completed. 10 modules were prepared in this manner.

10 modules each of the above-explained two kinds were prepared, and subjected to a comparative test for confirming the effect of the present example, in same apparatus and procedure as in the example 14.

In the measurement of electrical performance after 1000 hours, in the 10 modules lacking the slit-shaped grooves, peeling in the end portions decrease of shunt resistance to 1/10 or less in comparison with the state prior to testing, or shortcircuiting was observed in 5 modules. On the other hand, in the 10 modules provided with slit-shaped grooves, similar phenomena were not observed. Thus, also in this example, the effect of slit-shaped grooves was proved.

EXAMPLE 16

Figure 26:
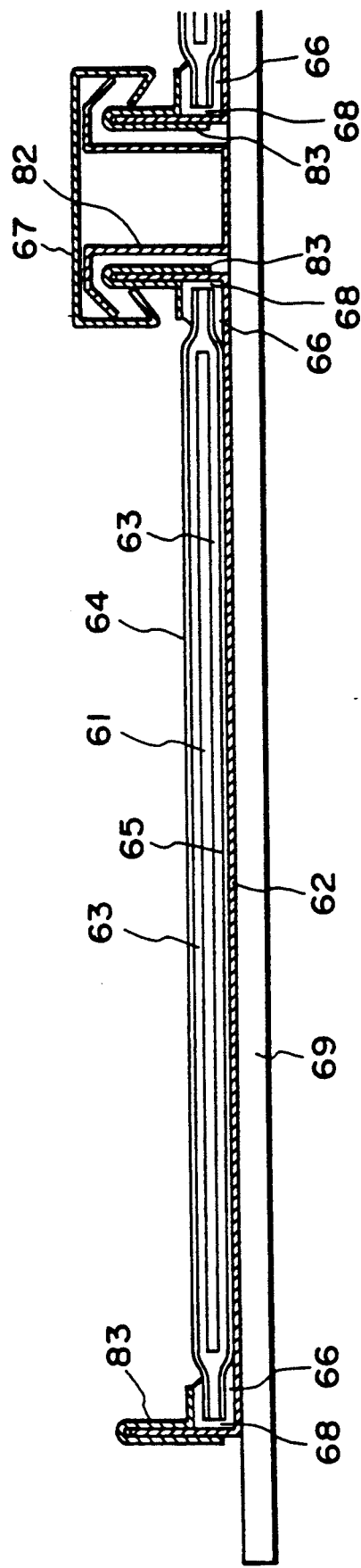

In this example, an experiment was conducted to confirm the effect, when the slit-shaped grooves 83 on the ends of the longer sides of the rear face protecting metal plate 62 had a folded structure as shown in FIG. 26. Said metal plate 62 of this example was rectangularly folded upwards at the end portions as in the example 15, and groove forming members 83 were so placed to cap said upward end portions. This configuration provides an advantage that the adhesion of the groove forming member 83 to the upward end portions of the metal plate 62 can be facilitated. For example, when said adhesion is achieved with an adhesive material, the thickness of the slit-shaped groove 68 is easier to define, and particular fixing members are not required for the members to be adhered, during the hardening of the adhesive material. Also in the case of adhesion with a grommet, the operation of pinching the members to be adhered can be facilitated. In the following there will be explained the procedure of preparation of the solar cell module of the present example.

Also in this example, the rear face protecting metal plate 62 was prepared with a galvanized steel plate of a thickness of ca. 0.3 mm, having a weather resistant treatment on one face thereof and a size of 1.5×0.40 m, by folding the both ends of the mutually opposed longer sides, over the entire width, upwards by a length of ca. 3 cm from the ends.

The groove forming member 83 was prepared from a galvanized steel plate of a thickness of ca. 0.3 mm, having a weather resistant treatment on one face thereof and a size of 1.5×0.06 m by rectangularly folding at a position of 1 cm from the end and over the entire length of 1.5 m, and further folding over 180° at a position of ca. 2.6 cm from the position of above-mentioned folding. Inside said 180° folded portion, there was formed a gap of ca. 0.5 mm so as to accommodate the upward folded portion of the metal plate 62. 20 units of said groove forming members 83 were prepared. Then an adhesive material was coated on the upward folded portions of the metal plate 62 and the groove forming members 83 were adhered thereto from above, thereby forming slit-shaped grooves 68 of a thickness of ca. 4 mm and a depth of ca. 10 mm, as shown in FIG. 26. Also in this example, the adhesion between the metal plate 62 and the groove forming members 83 was achieved with an adhesive material, but said adhesion may also be performed by welding or soldering, or with a junction member such as a grommet. FIG. 26 is a schematic cross-sectional view, showing a state in which the solar cell seal portions are inserted in the groove forming members 83 and the rear face protecting metal plate 62 combined in the above-explained procedure.

On the other hand, the end portions of the mutually opposed shorter sides were folded as in the example 15 thereby forming slit-shaped grooves with a thickness of ca. 4 mm and a depth of ca. 1 cm.

The method of preparation and the materials of the amorphous solar cell device, and the method, materials, and conditions of lamination were identical with those in the example 15. 10 units each of the modules with the slit-shaped grooves and the conventional modules without such grooves were prepared. In the present example, a mounting member 67, 82 of a cross section shown in FIG. 26 was employed for mounting the batten-seam member.

These modules were subjected to a comparative test for confirming the effect of the present example, employing the same apparatus as in examples 1 and 2.

In the measurement of electrical performance after 1000 hours, in the 10 modules without the slit-shaped grooves, peeling of the end portion in the solar cell seal portions, reduction of shunt resistance to 1/10 or lower in comparison with the state prior to testing, or shortcircuiting was observed in 4 modules. On the other hand, in the 10 modules with the slit-shaped grooves, such phenomena were not observed. Thus, also in this example, the effect of the slit-shaped grooves was confirmed.

As explained in the foregoing, in a solar cell module which includes plural seal portions, a rear face metal protecting plate serving as a support member, and a batten-seam member for protecting vertically positioned ones among the neighboring end portions of said rear face metal protecting plates when they are installed on a roof and in which said seal portions are integrated with the roofing material, slit-shaped grooves are provided at the ends of said metal plate, said grooves being formed by means of said metal plate and independent members, thereby preventing the peeling or damage of end portions of said seal portions of the solar cells and also preventing the intrusion of water vapor from said end portions to the solar cell device, whereby the failure of solar cell device and shortcircuit of the internal wirings of the solar cell module can be avoided.

Figure 28:
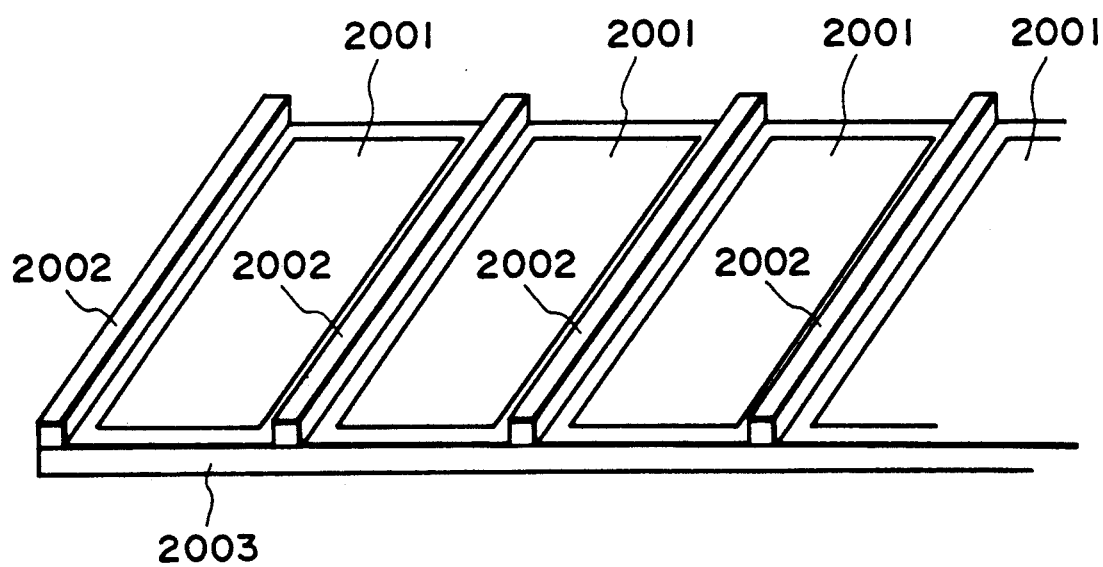
FIG. 28 is a schematic external perspective view of the solar cell module of the present invention.

FIG. 28 is a schematic view showing the final form of the solar cell modules of the present invention, wherein there are shown solar cells 2001 each including a photovoltaic device covered with covering materials; a support member 2003 therefor, provided at the ends of the solar cells 2001; and protective member for each two neighboring solar cells. These members are constructed as explained in the examples 1-16.

We claim:

1. A solar cell module comprising at least one photovoltaic device, covering material for covering said at least one photovoltaic device, and a frame for covering the end portions of said covering materials;
   wherein said covering materials are provided, in the end portions thereof, with a recess or a penetrating hole, and said frame is provided with a projection adapted to engage with said recess or penetrating hole.

2. A solar cell module according to claim 1, wherein said projection is composed of an engaging member which passes through a penetrating hole provided in said frame and engages with said penetrating hole of the end portions of said covering materials.

3. A solar cell module according to claim 2, wherein said engaging member has an external diameter "a" equal to or larger than 5 mm in an externally exposed portion, and has a ratio a/b of said external diameter to a shaft diameter "b" in said penetrating hole equal to or larger than 1.2.

4. A solar cell module according to claim 2, wherein said engaging member is composed of an eyelet having a penetrating hole in the center.

5. A solar cell module according to claim 1, wherein said frame projection is provided integrally with a groove for accommodating the end portions of said covering materials, and the width of said groove is, at least in part, smaller than the thickness of the end portions of said covering materials.

6. A solar cell module according to claim 1, wherein said frame projection is provided integrally with a groove and said projection is provided in plural number in mutually opposed relationship in the groove.

7. A solar cell module according to claim 1, wherein a thickness of each end portion of said covering materials is less than a thickness of a portion of the solar cell wherein the covering materials sandwich said at least one photovoltaic device, and a thickness of the recess or penetrating hole of each end portion of the covering materials engaging with said projections is less than the thickness of the remainder of the end portion.

8. A solar cell module according to claim 1, wherein said at least one photovoltaic device includes a non-monocrystalline semiconductor layer.

9. A solar cell module according to claim 1, wherein said at least one photovoltaic device includes an amorphous silicon layer.

10. A solar cell module according to claim 1, comprising a plurality of said photovoltaic devices, which are serially connected.

11. A solar cell module comprising:
    a solar cell portion including at least one photovoltaic device, and covering materials for covering said at least one photovoltaic device;
    a support member for supporting said at least one solar cell; and
    a protective member for protecting end portions of at least two adjacent support members in an array of a plurality of said support members;
    wherein said support member is composed of a deformable plate-shaped member, end portions of which are so folded as to form grooves for accommodating the end portions of said covering materials.

12. A solar cell module according to claim 11, wherein said grooves are each provided with at least one projection adapted to engage with a recess or penetrating hole provided in said covering materials.

13. A solar cell module comprising:
    a solar cell portion including at least one photovoltaic device, and covering materials for covering said at least one photovoltaic device;
    a support member for supporting said at least one solar cell; and
    a protective member for protecting end portions of at least two adjacent support members in an array of a plurality of said support members;
    wherein said support member is provided, at the end portions thereof, with independent members so as to form grooves for accommodating the end portions of said covering materials.

14. A solar cell module according to claim 13, wherein said grooves are each provided with a projection adapted to engage with a recess or a penetrating hole provided in said covering materials.

* * * * *

UNITED STATES PATENT AND TRADEMARK OFFICE
CERTIFICATE OF CORRECTION

PATENT NO. : 5,252,141
DATED : October 12, 1993
INVENTOR(S) : YUJI INOUE ET AL.   Page 1 of 5

It is certified that error appears in the above-identified patent and that said Letters Patent is hereby corrected as shown below:

COLUMN 2

Line 24, "laminar" should read --laminate--.

COLUMN 4

Line 57, "of" should be deleted.
Line 64, "support" should read --a support--.

COLUMN 5

Line 33, "$Cd_{2x}Sn_4$," should read --$Cd_2Sn_4$,--.

COLUMN 6

Line 1, "other," should read --other hand,--.
Line 35, "cross sectional" should read
    --cross-sectional--.

COLUMN 7

Line 18, "$SiH_4$, $B_2H_6$," should read --$SiH_4$, $PH_3$, $B_2H_6$,--.

COLUMN 8

Line 6, "example 1," should read --Example 1,--.
Line 13, "frame 109;" should read --frame 108;--.
Line 26, "example 1," should read --Example 1,--.
Line 52, "example 1" should read --Example 1--.
Line 58, "examples" should read --Examples--.

UNITED STATES PATENT AND TRADEMARK OFFICE
CERTIFICATE OF CORRECTION

PATENT NO. : 5,252,141
DATED : October 12, 1993
INVENTOR(S) : YUJI INOUE ET AL.

It is certified that error appears in the above-identified patent and that said Letters Patent is hereby corrected as shown below:

COLUMN 9

Line 18, "life;" should read --life,--.
Line 58, "material" should read --material 4--.

COLUMN 10

Line 28, "intrude" should read --intrude into--.
Line 36, "an" should read --one--.
Line 63, "example 6," should read --Example 6,--.

COLUMN 11

Line 32, "$H_2$,a nd" should read --$H_2$, and--.
Line 33, "$Bf_3$" should read --$BF_3$--.

COLUMN 13

Line 18, "example 8." shoud read --Example 8.--.
Line 32, "example 8," should read --Example 8,--.
Line 59, "examples 1-10." should read --Examples 1-10.--.

COLUMN 14

Line 43, "if" should read --is--.
Line 68, "examples 1-10, should read --Examples 1-10,--.

COLUMN 15

Line 57, "dimension" should read --dimensions--.

UNITED STATES PATENT AND TRADEMARK OFFICE
CERTIFICATE OF CORRECTION

PATENT NO. : 5,252,141
DATED : October 12, 1993
INVENTOR(S) : YUJI INOUE ET AL.

It is certified that error appears in the above-identified patent and that said Letters Patent is hereby corrected as shown below:

COLUMN 16

Line 26, "examples" should read --Examples--.
Line 28, "examples" should read --Examples--.
Lines 38-62, lines 38-62 should be deleted.
Line 67, "tim" should read --tin--.

COLUMN 17

Line 68, "let" should read --left--.

COLUMN 18

Line 19, "prepare" should read --prepared--.

COLUMN 19

Line 54, "example" should read --Example--.
Line 60, "example" (both occurrences) should read --Example--.
Line 64, "example" should read --Example--.
Line 68, "example" should read --Example--.

COLUMN 20

Line 5, "example" should read --Example--.
Line 44, "example" should read --Example--.
Line 63, "examples 11 and 12." should read --Examples 11 and 12.--.

UNITED STATES PATENT AND TRADEMARK OFFICE
CERTIFICATE OF CORRECTION

PATENT NO. : 5,252,141
DATED : October 12, 1993
INVENTOR(S) : YUJI INOUE ET AL.

It is certified that error appears in the above-identified patent and that said Letters Patent is hereby corrected as shown below:

COLUMN 21

Line 10, "example" should read --Example--.
Line 16, "example" should read --Example--.
Line 25, "examples" should read --Examples--.

COLUMN 22

Line 16, "cross sectional" should read --cross-sectional--.
Line 39, "dimension" should read --dimensions--.

COLUMN 23

Line 12, "examples 1-10." should read --Examples 1-10.--.
Line 35, "while" should read --white--.

COLUMN 25

Line 30, "experinece" should read --experiences--.
Line 32, "deteriorate" should read --deteriorated--.

COLUMN 26

Line 48, "example" should read --Example--.
Line 59, "example" should read --Example--.
Line 64, "example" (both occurrences) should read --Example--.

UNITED STATES PATENT AND TRADEMARK OFFICE
CERTIFICATE OF CORRECTION

PATENT NO. : 5,252,141
DATED : October 12, 1993
INVENTOR(S) : YUJI INOUE ET AL.

Page 5 of 5

It is certified that error appears in the above-identified patent and that said Letters Patent is hereby corrected as shown below:

COLUMN 27

Line 2, "example" should read --Example--.
Line 41, "example" should read --Example--.

COLUMN 28

Line 39, "example" should read --Example--.
Line 45, "example" should read --Example--.
Line 53, "examples" should read --Examples--.

COLUMN 29

Line 18, "example" should read --Example--.
Line 23, "materials;" should read --materials,--.

COLUMN 30

Line 44, "members;" should read --members,--.

Signed and Sealed this

Twenty-sixth Day of July, 1994

Attest:

BRUCE LEHMAN

Attesting Officer     Commissioner of Patents and Trademarks